US012777876B2

(12) United States Patent
Pandey et al.

(10) Patent No.: US 12,777,876 B2
(45) Date of Patent: Oct. 27, 2026

(54) HEAT TRANSFER JACKETS AND SENSOR ASSEMBLIES, AND RELATED METHODS AND PROCESSING CHAMBERS, FOR SEMICONDUCTOR MANUFACTURING

(71) Applicant: Applied Materials, Inc., Santa Clara, CA (US)

(72) Inventors: Vishwas Kumar Pandey, Madhya Pradesh (IN); Ala Moradian, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 390 days.

(21) Appl. No.: 18/487,895

(22) Filed: Oct. 16, 2023

(65) Prior Publication Data

US 2025/0125164 A1 Apr. 17, 2025

(51) Int. Cl.
*G01K 1/12* (2006.01)
*G01D 11/24* (2006.01)
*H10P 72/00* (2026.01)

(52) U.S. Cl.
CPC ........ *H10P 72/0431* (2026.01); *G01D 11/245* (2013.01); *G01K 1/12* (2013.01)

(58) Field of Classification Search
CPC ... G01D 11/245; G01K 1/12; H01L 21/67098
See application file for complete search history.

(56) References Cited

U.S. PATENT DOCUMENTS

| | | | | |
|---|---|---|---|---|
| 8,245,764 | B2 | 8/2012 | Eriksen | |
| 2014/0265670 | A1* | 9/2014 | Chamberlin | H02K 5/203 310/58 |
| 2015/0198331 | A1* | 7/2015 | Palmer | F23L 9/00 110/297 |
| 2017/0051246 | A1* | 2/2017 | Galliher | B01J 19/006 |

(Continued)

FOREIGN PATENT DOCUMENTS

| | | | | |
|---|---|---|---|---|
| CN | 101317314 | A | 12/2008 | |
| DE | 102012215018 | A1 * | 2/2014 | H02K 5/203 |

(Continued)

OTHER PUBLICATIONS

International Search Report and Written Opinion dated Oct. 14, 2024 for Application No. PCT/US2024/036585.

(Continued)

*Primary Examiner* — Jamel E Williams
(74) *Attorney, Agent, or Firm* — Patterson + Sheridan, LLP

(57) ABSTRACT

The present disclosure relates to heat transfer jackets and sensor assemblies, and related methods and processing chambers, for semiconductor manufacturing. In one or more embodiments, a jacket applicable for semiconductor manufacturing includes one or more outer walls bounding a plurality of fluid channels, and an inner wall at least partially surrounded by at least one of the plurality of fluid channels. The inner wall at least partially defines a receptacle opening. The jacket includes a fluid inlet formed in at least one of the one or more outer walls, a fluid outlet formed in at least one (Continued)

of the one or more outer walls, and a plurality of partition walls separating the plurality of fluid channels. At least one of the plurality of partition walls intersects at least one of the one or more outer walls.

20 Claims, 15 Drawing Sheets

(56) References Cited

U.S. PATENT DOCUMENTS

| | | | |
|---|---|---|---|
| 2018/0130652 A1 | 5/2018 | Pettinger et al. | |
| 2019/0301009 A1* | 10/2019 | Kaufman-Osborn | H01L 21/67103 |
| 2023/0018891 A1* | 1/2023 | Che | C23C 14/56 |

FOREIGN PATENT DOCUMENTS

| | | | |
|---|---|---|---|
| DE | 102015220509 A1 * | 4/2016 | H02K 5/203 |
| DE | 102021201804 A1 * | 8/2022 | H02K 5/203 |

OTHER PUBLICATIONS

Taiwan Office Action dated Nov. 11, 2024 for Application No. 113125099.

* cited by examiner

| CASE | MAX. T (°C) | PRESS. DROP (PSI) |
|---|---|---|
| 1 | 154 | 14.72 |
| 2 | 37 | 25.4 |
| 3 | 42 | 14.9 |
| 4 | 33 | 15.38 |

FIG. 21

| CASE | POWER | MAX. T (°C) |
|---|---|---|
| 1 | 1kW | 63.78 |
| 2 | 2kW | 102.3 |
| 3 | 1kW | 49 |
| 4 | 2kW | 75 |

FIG. 22

HEAT TRANSFER JACKETS AND SENSOR ASSEMBLIES, AND RELATED METHODS AND PROCESSING CHAMBERS, FOR SEMICONDUCTOR MANUFACTURING

BACKGROUND

Field

The present disclosure relates to heat transfer jackets and sensor assemblies, and related methods and processing chambers, for semiconductor manufacturing.

Description of the Related Art

Semiconductor substrates are processed for a wide variety of applications, including the fabrication of integrated devices and microdevices. One method of processing substrates includes depositing a material, such as a semiconductor material or a conductive material, on an upper surface of the substrate. For example, epitaxy is one deposition process that deposit films of various materials on a surface of a substrate in a processing chamber. During processing, various parameters can affect the uniformity of material deposited on the substrate.

Sensor devices can be used to measure properties in relation to substrate processing. During processing operations sensor devices can heat up, which can hinder accuracy of measurements and/or degrade the sensors. For example, parts of sensor devices can crack under thermal loading, which can hinder measurement and/or damage chamber components. Degradation of sensor devices can hinder the operational lifespans of sensors. Moreover, efforts to cool sensor devices can be limited with respect to temperature gradients and maximum temperatures. Efforts to cool sensor devices can be complex in design and fabrication, and can be limited in modularity. Such complications can also hinder processing efficacy, such as film thickness uniformity.

Therefore, a need exists for improved heat transfer apparatus.

SUMMARY

The present disclosure relates to heat transfer jackets and sensor assemblies, and related methods and processing chambers, for semiconductor manufacturing.

In one or more embodiments, a jacket applicable for semiconductor manufacturing includes one or more outer walls bounding a plurality of fluid channels, and an inner wall at least partially surrounded by at least one of the plurality of fluid channels. The inner wall at least partially defines a receptacle opening. The jacket includes a fluid inlet formed in at least one of the one or more outer walls, a fluid outlet formed in at least one of the one or more outer walls, and a plurality of partition walls separating the plurality of fluid channels. At least one of the plurality of partition walls intersects at least one of the one or more outer walls.

In one or more embodiments, a sensor assembly applicable for semiconductor manufacturing includes a jacket and a sensor device. The jacket includes one or more outer walls bounding a plurality of fluid channels, an inner wall at least partially defining a receptacle opening, a fluid inlet, a fluid outlet, and a plurality of partition walls separating the plurality of fluid channels. At least one of the plurality of partition walls intersects at least one of the one or more outer walls. The jacket includes one or more mounting flanges extending outwardly relative to the inner wall. The sensor device is disposed at least partially in the receptacle opening of the jacket. The sensor device includes a housing mounted to the jacket, and a sensor configured to detect one or more properties.

In one or more embodiments, a method of making jackets applicable for semiconductor manufacturing includes melting a stock material, forming the melted stock material into a section and allowing the section to cure, and repeating the melting, the forming, and the curing for one or more additional section to form a jacket. The jacket includes one or more outer walls bounding a plurality of fluid channels, an inner wall at least partially defining a receptacle opening, a fluid inlet, and a fluid outlet. The jacket includes a plurality of partition walls separating the plurality of fluid channels. At least one of the plurality of partition walls intersects at least one of the one or more outer walls.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 21 is a schematic table view of pressure drop values and maximum temperature values for a variety of jacket cases, according to one or more embodiments.

FIG. 22 is a schematic table view of power values and maximum temperature values for a variety of jacket cases, according to one or more embodiments.

Figure 1:
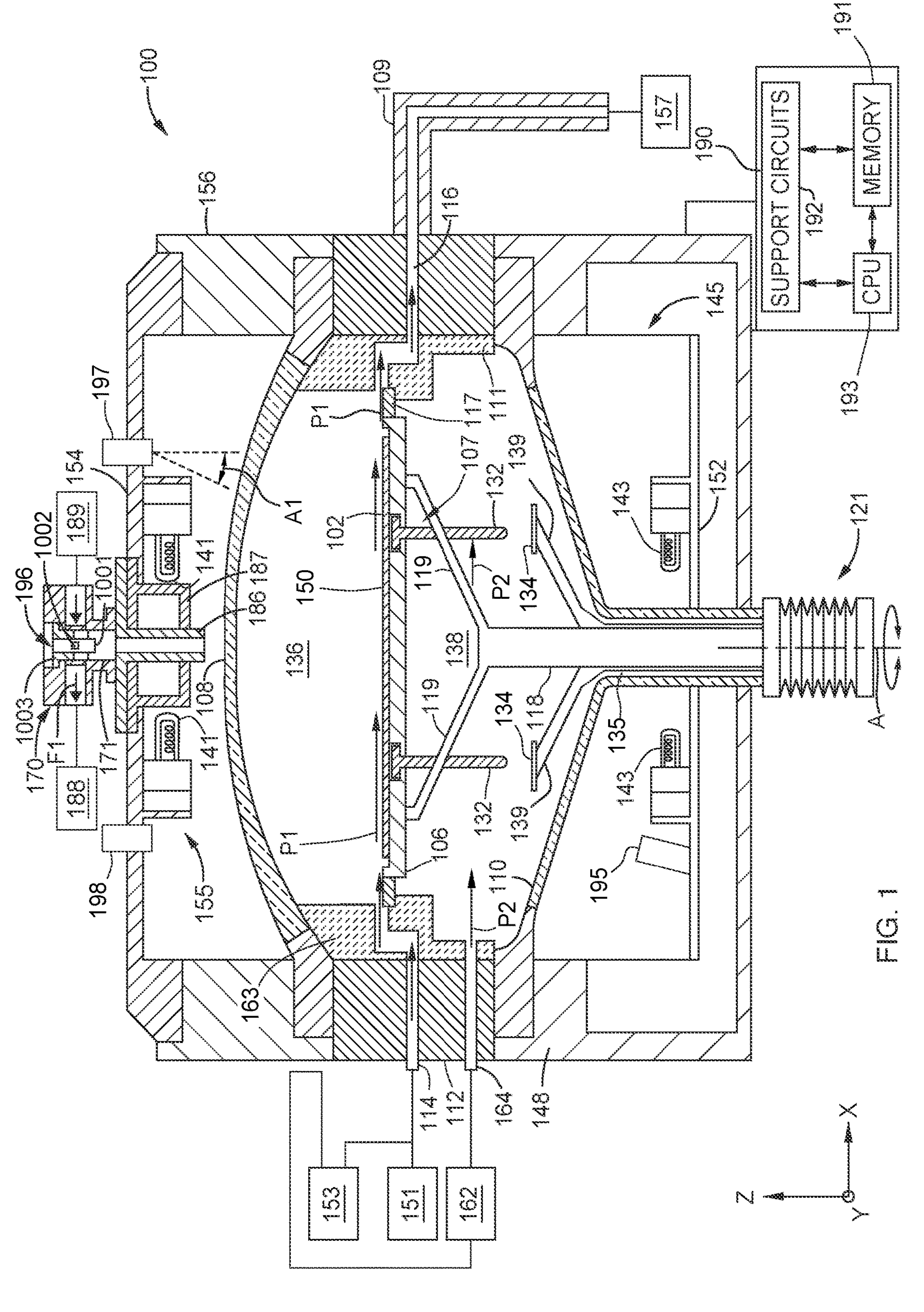
FIG. 1 is a schematic side cross-sectional view of a processing chamber, according to one or more embodiments.

For visual clarity purposes, hatching is omitted from FIGS. 2, 3, 7-9, 11-14, and 18. For visual clarity purposes, ghost profiles are also shown as solid in FIGS. 4-7 and 11.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to heat transfer jackets and sensor assemblies, and related methods and processing chambers, for semiconductor manufacturing. In one or more embodiments, a temperature sensor is disposed at least partially in a jacket, and a cooling fluid is flowed through the jacket to cool the jacket.

The disclosure contemplates that terms such as "couples," "coupling," "couple," and "coupled" may include but are not limited to bonding, embedding, welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

FIG. 1 is a schematic side cross-sectional view of a processing chamber 100, according to one or more embodiments. The processing chamber 100 is a deposition chamber. In one or more embodiments, the processing chamber 100 is an epitaxial deposition chamber. The processing chamber 100 is utilized to grow an epitaxial film on a substrate 102. The processing chamber 100 creates a cross-flow of precursors across a top surface 150 of the substrate 102. The processing chamber 100 is shown in a processing condition in FIG. 1.

The processing chamber 100 includes an upper body 156, a lower body 148 disposed below the upper body 156, and a flow module 112 disposed between the upper body 156 and the lower body 148. The upper body 156, the flow module 112, and the lower body 148 form a chamber body. Disposed within the chamber body is a substrate support 106, an upper window 108 (such as an upper dome), a lower window 110 (such as a lower dome), a plurality of upper heat sources 141, and a plurality of lower heat sources 143. In one or more embodiments, the upper heat sources 141 include upper lamps and the lower heat sources 143 include lower lamps. The present disclosure contemplates that other heat sources may be used (in addition to or in place of the lamps) for the various heat sources described herein. For example, resistive heaters, light emitting diodes (LEDs), and/or lasers may be used for the various heat sources described herein.

The substrate support 106 is disposed between the upper window 108 and the lower window 110. The substrate support 106 supports the substrate 102. In one or more embodiments, the substrate support 106 includes a susceptor. Other substrate supports (including, for example, a substrate carrier and/or one or more ring segment(s) that support one or more outer regions of the substrate 102) are contemplated by the present disclosure. The plurality of upper heat sources 141 are disposed between the upper window 108 and a lid 154. The plurality of upper heat sources 141 form a portion of the upper heat source module 155.

The plurality of lower heat sources 143 are disposed between the lower window 110 and a floor 152. The plurality of lower heat sources 143 form a portion of a lower heat source module 145. The upper window 108 is an upper dome and/or is formed of an energy transmissive material, such as quartz. The lower window 110 is a lower dome and/or is formed of an energy transmissive material, such as quartz.

An upper volume 136 and a purge volume 138 are formed between the upper window 108 and the lower window 110. The upper volume 136 and the purge volume 138 are part of an internal volume defined at least partially by the upper window 108, the lower window 110, and one or more liners 111, 163. In one or more embodiments, the upper volume 136 is a processing volume.

The internal volume has the substrate support 106 disposed therein. The substrate support 106 includes a top surface on which the substrate 102 is disposed. The substrate support 106 is attached to a shaft 118. In one or more embodiments, the substrate support 106 is connected to the shaft 118 through one or more arms 119 connected to the shaft 118. The shaft 118 is connected to a motion assembly 121. The motion assembly 121 includes one or more actuators and/or adjustment devices that provide movement and/or adjustment for the shaft 118 and/or the substrate support 106 within the upper volume 136.

The substrate support 106 may include lift pin holes 107 disposed therein. The lift pin holes 107 are each sized to accommodate a lift pin 132 for lifting of the substrate 102 from the substrate support 106 before or after a deposition process is performed. The lift pins 132 may rest on lift pin stops 134 when the substrate support 106 is lowered from a process position to a transfer position. The lift pin stops 134 can include a plurality of arms 139 that attach to a shaft 135.

The flow module 112 includes one or more gas inlets 114 (e.g., a plurality of gas inlets), one or more purge gas inlets 164 (e.g., a plurality of purge gas inlets), and one or more gas exhaust outlets 116. The one or more gas inlets 114 and the one or more purge gas inlets 164 are disposed on the opposite side of the flow module 112 from the one or more gas exhaust outlets 116. The one or more purge gas inlets 164 may be disposed perpendicular to one or more gas inlets 114 and/or the one or more gas exhaust outlets 116. A pre-heat ring 117 is disposed below the one or more gas inlets 114 and the one or more gas exhaust outlets 116. The pre-heat ring 117 is disposed above the one or more purge gas inlets 164. The one or more liners 111, 163 are disposed on an inner surface of the flow module 112 and protects the flow module 112 from reactive gases used during deposition operations and/or cleaning operations. The gas inlet(s) 114 and the purge gas inlet(s) 164 are each positioned to flow a respective one or more process gases P1 and one or more purge gases P2 parallel to the top surface 150 of a substrate 102 disposed within the upper volume 136. The gas inlet(s) 114 and the purge gas inlet(s) 164 may optionally be positioned perpendicular to the top surface 150 of a substrate 102 disposed within the upper volume 136. The gas inlet(s) 114 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. The one or more process gases P1 supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). The one or more purge gases P2 supplied using the one or more purge gas sources 162 can include one or more inert gases (such as one or more of argon (Ar), helium (He), and/or nitrogen ($N_2$)). One or more cleaning gases supplied using the one or more cleaning gas sources 153 can include one or more of hydrogen (H) and/or chlorine (Cl). In one or more embodiments, the one or more process gases P1 include silicon phosphide (SiP) and/or phospine ($PH_3$), and the one or more cleaning gases include hydrochloric acid (HCl).

The one or more gas exhaust outlets 116 are further connected to or include an exhaust system 109. The exhaust system 109 fluidly connects the one or more gas exhaust outlets 116 and the exhaust pump 157. The exhaust system 109 can assist in the controlled deposition of a layer on the substrate 102. The exhaust system 109 is disposed on an opposite side of the processing chamber 100 relative to the flow module 112.

The processing chamber 100 includes the one or more liners 111, 163 (e.g., a lower liner 111 and an upper liner 163). The flow module 112 (which can be at least part of a sidewall of the processing chamber 100) includes the one or more gas inlets 114 in fluid communication with the upper volume 136. The one or more gas inlets 114 are in fluid communication with one or more flow gaps between the upper liner 163 and a lower liner 111.

During a deposition operation (e.g., an epitaxial growth operation), the one or more process gases P1 flow through the one or more gas inlets 114, through the one or more gaps, and into the upper volume 136 to flow over the substrate 102.

The present disclosure also contemplates that the one or more purge gases P2 can be supplied to the purge volume 138 (through the one or more purge gas inlets 164) during the deposition operation, and exhausted from the purge volume 138. The one or more purge gases P2 flow simultaneously with the flowing of the one or more process gases P1. The one or more process gases P1 are exhausted through gaps between the upper liner 163 and the lower liner 111, and through the one or more gas exhaust outlets 116. The one or more purge gases P2 can be exhausted through one or more outlet openings (such as after flowing up through a gap between the pre-heat ring 117 and the substrate support 106), and through the same one or more gas exhaust outlets 116 as the one or more process gases P1. The present disclosure contemplates that that the one or more purge gases P2 can be separately exhausted through one or more second gas exhaust outlets that are separate from the one or more gas exhaust outlets 116 without flowing up to the upper volume 136 from the bottom purge volume 138.

During a cleaning operation, one or more cleaning gases flow through the one or more gas inlets 114, through the one or more gaps (between the upper liner 163 and the lower liner 111), and into the upper volume 136.

The processing system includes one or more sensor devices 195, 196, 197, 198 (e.g., temperature sensors) configured to measure parameter(s) (e.g., temperature(s)) within the processing chamber 100. In one or more embodiments, the one or more temperature sensor devices 195, 196, 197, 198 include a central sensor device 196 and one or more outer sensor devices 195, 197, 198. A controller 190 (described below) can control the one or more sensor devices 195, 196, 197, 198, and can conduct method(s) analyzing uniformity of substrate processing using at least one of the one or more sensor devices 195, 196, 197, 198. In one or more embodiments, the one or more sensor devices 195, 196, 197, 198 each include a sensor that includes one or more of silicon (Si), carbon (C), gallium (Ga), and/or nitrogen (N). In one or more embodiments, the one or more sensor devices 195, 196, 197, 198 each include a silicon sensor, a silicon carbide (SiC) sensor, and/or a gallium nitride (GaN) sensor. In one or more embodiments, each sensor device 195, 196, 197, 198 is a pyrometer and/or optical sensor, such as an optical pyrometer. The present disclosure contemplates that sensor devices other than pyrometers may be used, and/or one or more of the sensor devices 195, 196, 197, 198 can measure properties (such as metrology properties) other than temperature. The present disclosure contemplates that the central sensor device 196 can be oriented such that a viewing axis is parallel (as shown in FIG. 1) to a longitudinal axis of the receptacle opening 275 shown in FIG. 2, or the central sensor device 196 can be oriented at an angle such that the viewing axis is at an oblique angle relative to the longitudinal axis of the receptacle opening 275.

In one or more embodiments, the one or more sensor devices 195, 196, 197, 198 include one or more upper sensor devices 196, 197, 198 disposed above the substrate 102 and adjacent the lid 154, and one or more lower sensor devices 195 disposed below the substrate 102 and adjacent the floor 152. The present disclosure contemplates that at least one of the one or more lower sensor devices 195 can be vertically aligned below at least one of the upper sensor devices 196, 196, 197 (such as outer sensor device 197).

Each sensor device 195, 196, 197, 198, can be a single-wavelength sensor device or a multi-wavelength (such as dual-wavelength) sensor device. In one or more embodiments, the system including the process chamber 100 includes any one, any two, or any three of the four illustrated sensor devices 195, 196, 197, 198. In one or more embodiments, the process chamber 100 includes one or more additional sensor devices, in addition to the sensor devices 195, 196, 197, 198. In one or more embodiments, the process chamber 100 may include sensor devices disposed at different locations and/or with different orientations than the illustrated sensor devices 195, 196, 197, 198.

At least one of the sensor devices 195, 196, 197, 198 (shown as the central sensor device 196) is disposed at least partially in a jacket 170. The jacket is a heat transfer jacket used to cool the central sensor device 196. A heat transfer fluid (e.g., a cooling fluid F1) is flowed through the jacket 170 to cool the central sensor device 196 during operation of the central sensor device 196. For example during temperature sensing operations the central sensor device 196 is powered, which can heat up the central sensor device 196. During operation of the central sensor device 196, the cooling fluid F1 flows from a cooling fluid source 189, through the jacket 170 to cool the jacket 170, and out of the jacket 170. A suction device 188 (such as a vacuum device) can be used to facilitate flow of the cooling fluid F1. The heat of the central sensor device 196 irradiates an inner surface 171 of the jacket 170. The irradiation on the inner surface 171 can have a power within a range of 0 kW to 2 kW, such as about 1 kW or 2 kW. Other values are contemplated for the power. In one or more embodiments, the jacket 170 is mounted above a central reflector 187 and a tube structure 186. The jacket 170 and the respective central sensor device 196 are part of a sensor assembly. The central sensor device 196 includes a housing 1001 mounted to the jacket 170 (e.g., using one or more brackets 1003), and a sensor 1002 configured to detect one or more properties (such as temperature and/or other properties such as film thickness and/or contaminant concentration). Hatching is not shown for certain features (such as the housing 1001 and the sensor 1002) in FIG. 1 for visual clarity purposes.

The present disclosure contemplates that the central sensor device 196 can be movable (e.g., pivotable). The present disclosure also contemplates that the central sensor device 196 can scan a field of view for measurements. For example, the central sensor device 196 can scan the field of view along an angle A1 (as is shown for sensor device 197 in FIG. 1).

As shown, a controller 190 is in communication with the processing chamber 100 and is used to control processes and methods, such as the operations of the methods described herein. The controller 190 is configured to receive data or input as sensor readings from sensor(s) (such as one or more of the sensor devices 195, 196, 197, 198). The sensor devices can include, for example: sensor devices that monitor growth of layer(s) on the substrate 102; and/or sensor devices that monitor temperatures of the substrate 102, the substrate support 106, and/or the liners 111, 163.

The controller 190 includes a central processing unit (CPU) 193 (e.g., a processor), a memory 191 containing instructions, and support circuits 192 for the CPU 193. The controller 190 controls various items directly, or via other computers and/or controllers. In one or more embodiments, the controller 190 is communicatively coupled to dedicated controllers, and the controller 190 functions as a central controller.

The controller 190 is of any form of a general-purpose computer processor that is used in an industrial setting for controlling various substrate processing chambers and equipment, and sub-processors thereon or therein. The memory 191, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits 192 of the controller 190 are coupled to the CPU 193 for supporting the CPU 193. The support circuits 192 include cache, power supplies, clock circuits, input/output circuitry and subsystems, and the like. Operational parameters (e.g., a power supplied to the sensor device 196, a flow rate and/or a pressure for a cooling fluid F1 through the jacket 170, a heating power applied to the heat sources 141, 143, a cleaning recipe, and/or a processing recipe) and operations are stored in the memory 191 as a software routine that is executed or invoked to turn the controller 190 into a specific purpose controller to control the operations of the various chambers/modules described herein. The controller 190 is configured to conduct any of the operations described herein. The instructions stored on the memory, when executed, cause one or more of the operations described herein to be conducted in relation to the processing chamber 100. The controller 190 and the processing chamber 100 are at least part of a system for processing substrates.

The various operations described herein can be conducted automatically using the controller 190, or can be conducted automatically or manually with certain operations conducted by a user.

The controller 190 is configured to control power to the sensor device 196, cooling fluid F1 flow through the jacket 170, the deposition, the cleaning, the rotational position, the heating, and gas flow through the processing chamber 100 by providing an output to the controls for the sensor devices 195, 196, 197, 198, the cooling fluid source 189, the suction device 188, the upper heat sources 141, the lower heat sources 143, the process gas source 151, the purge gas source 162, the motion assembly 121, and/or the exhaust pump 157.

Figure 2:
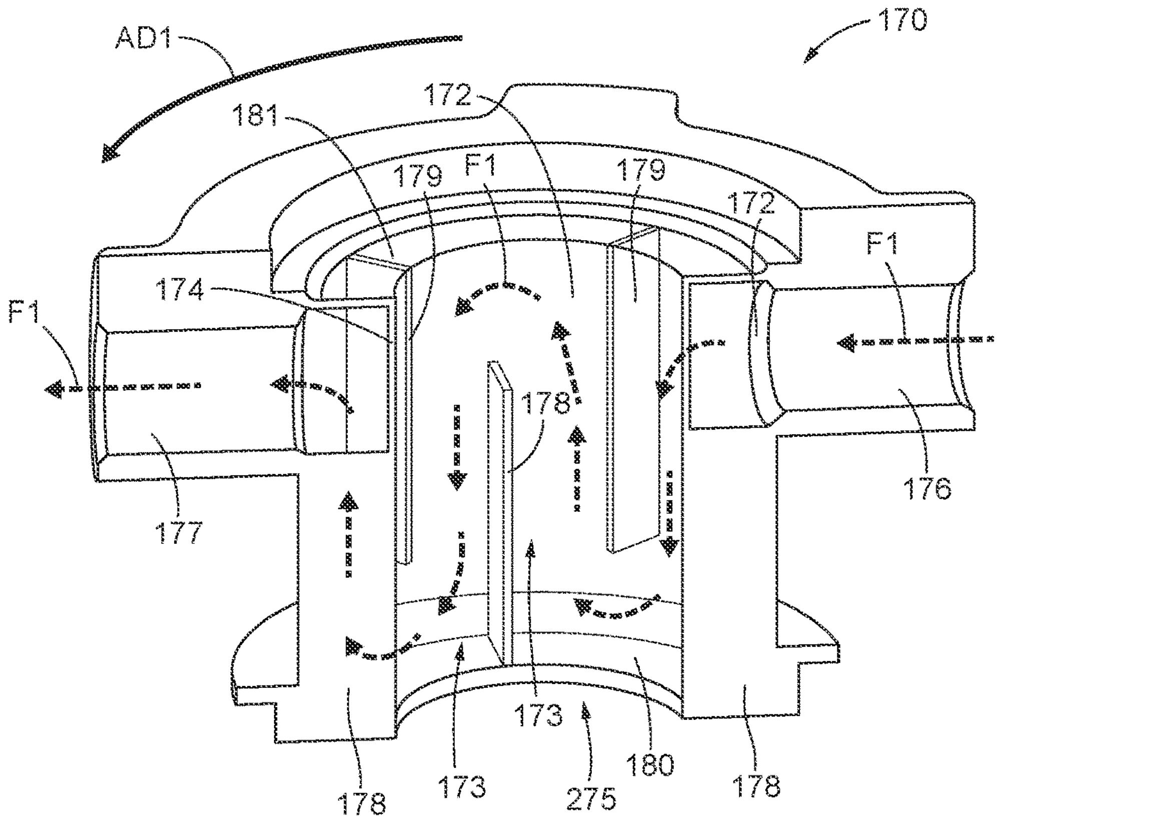
FIG. 2 is a schematic perspective cross-sectional view of the jacket shown in FIG. 1, according to one or more embodiments.

FIG. 2 is a schematic perspective cross-sectional view of the jacket 170 shown in FIG. 1, according to one or more embodiments.

The jacket 170 includes one or more outer walls 172 bounding a plurality of fluid channels 173, and an inner wall 174 at least partially surrounded by at least one of the plurality of fluid channels 173. The inner wall 174 at least partially defines a receptacle opening 275. The jacket 170 includes a fluid inlet 176 formed in at least one of the one or more outer walls 172, and a fluid outlet 177 formed in at least one of the one or more outer walls 172. The jacket 170 includes a plurality of partition walls 178, 179 separating the plurality of fluid channels 173. At least one of the plurality of partition walls 178, 179 intersects at least one of the one or more outer walls 172.

The jacket 170 includes a first arcuate wall 180 and a second arcuate wall 181. The first and second arcuate walls 180, 181 extend between the inner wall 174 and at least one of the one or more outer walls 172. In one or more embodiments, the one or more outer walls 172 includes a single cylindrical wall, and the inner wall 174 is cylindrical in shape.

The plurality of partition walls 178, 179 include a set of first partition walls 178 extending between the inner wall 174 and at least one of the one or more outer walls 172. The first partition walls 178 intersect the first arcuate wall 180 and are spaced from the second arcuate wall 181. The plurality of partition walls 178, 179 include a set of second partition walls 179 extending between the inner wall 174 and at least one of the one or more outer walls 172. The second partition walls 179 intersect the second arcuate wall 181 and are spaced from the first arcuate wall 180.

The first partition walls 178 and the second partition walls 179 are disposed in an alternating arrangement along an arcuate direction AD1 to define a serpentine flow path along the arcuate direction AD1 for the cooling fluid F1.

Figure 3:
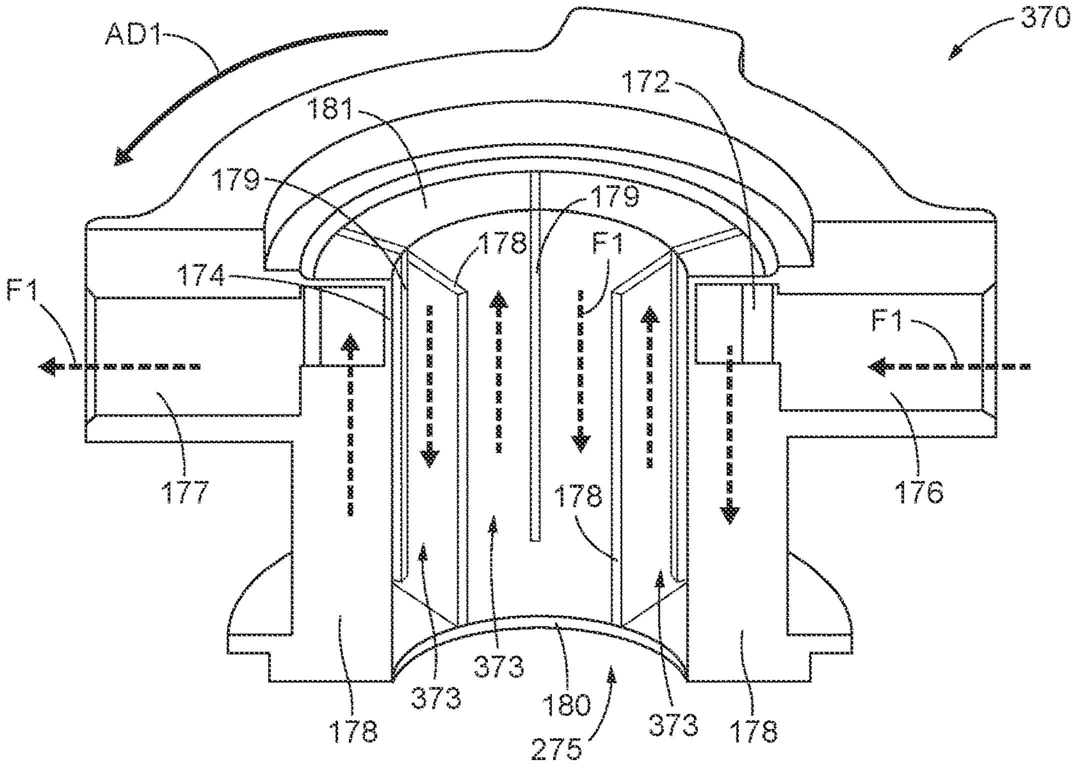
FIG. 3 is a schematic side cross-sectional view of a jacket, according to one or more embodiments.

FIG. 3 is a schematic side cross-sectional view of a jacket 370, according to one or more embodiments. The jacket 370 can be used in place of the jacket 170 shown in FIG. 1. The jacket 370 includes one or more aspects, features, components, operations, and/or properties of the jacket 170. Compared to the jacket 170, the jacket 370 includes a larger number of first partition walls 178 and a larger number of second partition walls 179 such that a plurality of fluid channels 373 are narrower than the fluid channels 173.

Figure 4:
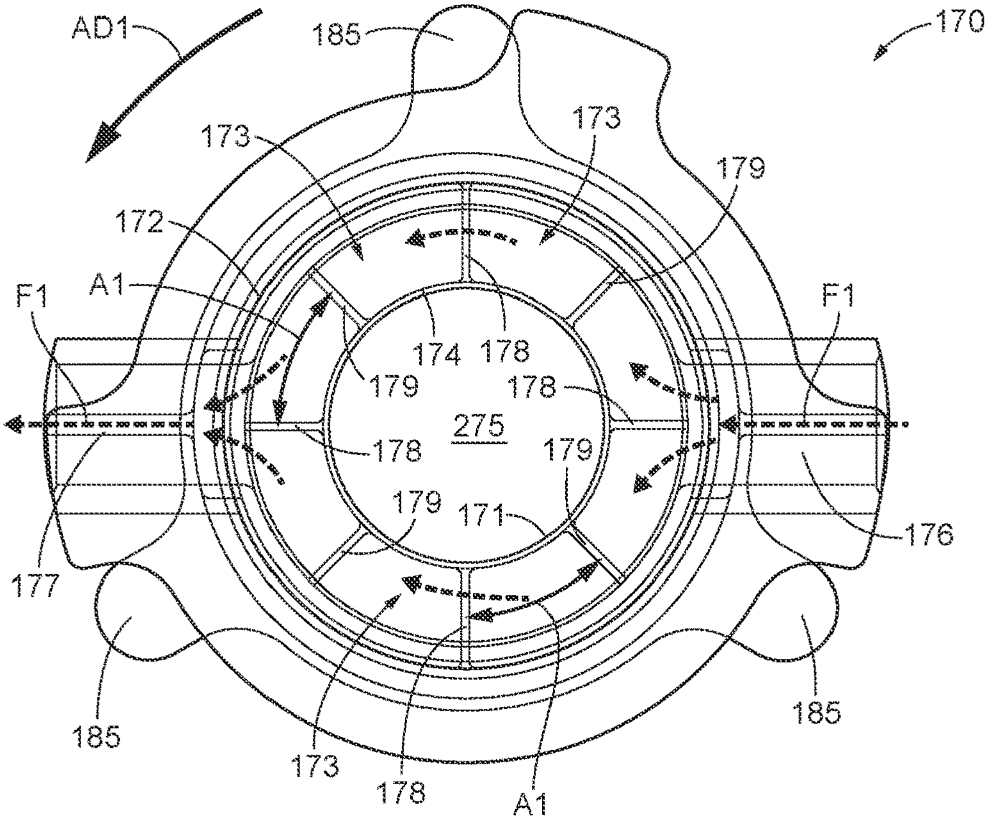
FIG. 4 is a schematic top view of the jacket shown in FIG. 2, according to one or more embodiments.

FIG. 4 is a schematic top view of the jacket 170 shown in FIG. 2, according to one or more embodiments. The jacket 170 includes eight partition walls 178, 179, including four first partition walls 178 and four second partition walls 179. The first partition walls 178 and the second partition walls 179 are spaced from each other by an azimuthal angle A1 within a range of 35 degrees to 55 degrees. In one or more embodiments, the azimuthal angle A1 is within a range of 40 degrees to 50 degrees, such as about 45 degrees. As shown in FIG. 4, the flow of cooling fluid F1 flowing out of the fluid inlet 176 is split to opposing sides of the receptacle opening 275. The split flow of the cooling fluid F1 is rejoined at the fluid outlet 177. The jacket 170 includes one or more mounting flanges 185 (a plurality, such as three, are shown) extending radially outwardly relative to the inner wall. The one or more mounting flanges 185 can abut against the chamber 100 (such as the tube structure 186) to facilitate maintaining the jacket 170 in an upright position. Fasteners can extend through the one or more mounting flanges 185 to fasten the jacket 170 to the chamber 100.

Figure 5:
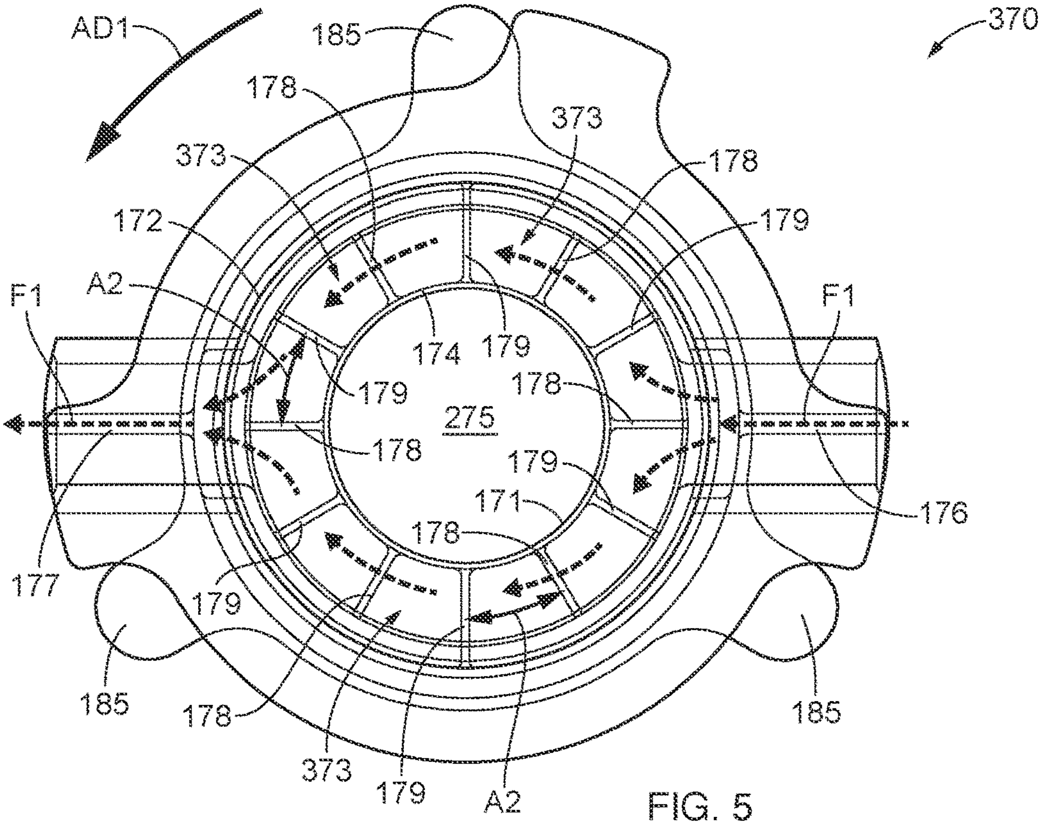
FIG. 5 is a schematic top view of the jacket shown in FIG. 3, according to one or more embodiments.

FIG. 5 is a schematic top view of the jacket 370 shown in FIG. 3, according to one or more embodiments. The jacket 370 includes twelve partition walls 178, 179, including six first partition walls 178 and six second partition walls 179. The first partition walls 178 and the second partition walls 179 are spaced from each other by an azimuthal angle A2 within a range of 20 degrees to 40 degrees. In one or more embodiments, the azimuthal angle A2 is within a range of 25 degrees to 35 degrees, such as about 30 degrees.

Figure 6:
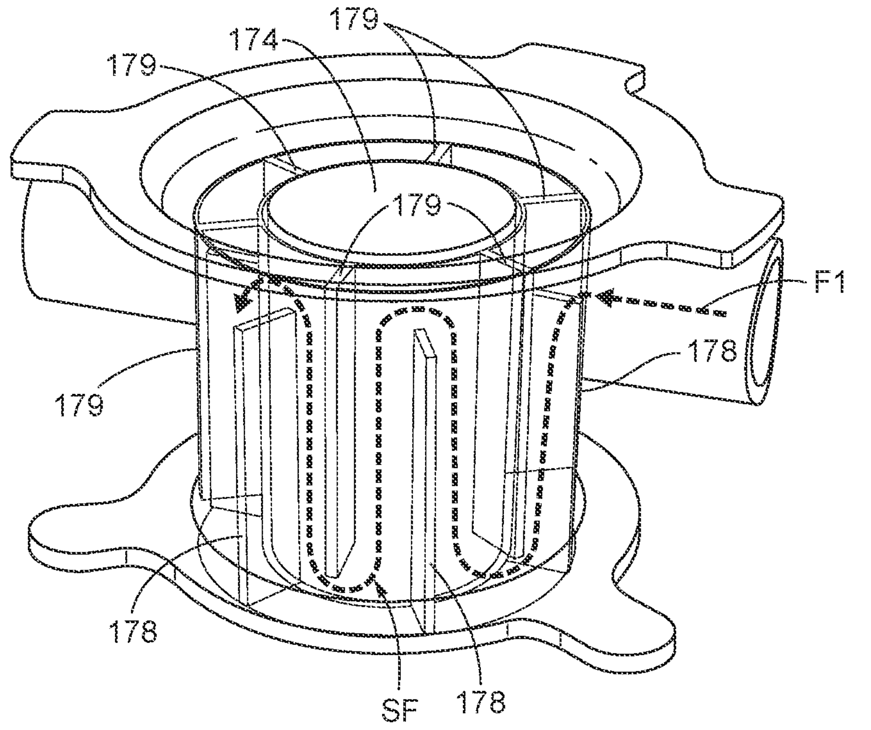
FIG. 6 is a schematic perspective view of a serpentine flow path of the jacket shown in FIGS. 3 and 5, according to one or more embodiments.

FIG. 6 is a schematic perspective view of a serpentine flow path SF of the jacket 370 shown in FIGS. 3 and 5, according to one or more embodiments. Following the serpentine flow path SF, the split flow of the cooling fluid F1 flows over the first partition walls 178 and under the second partition walls 179.

Figure 7:
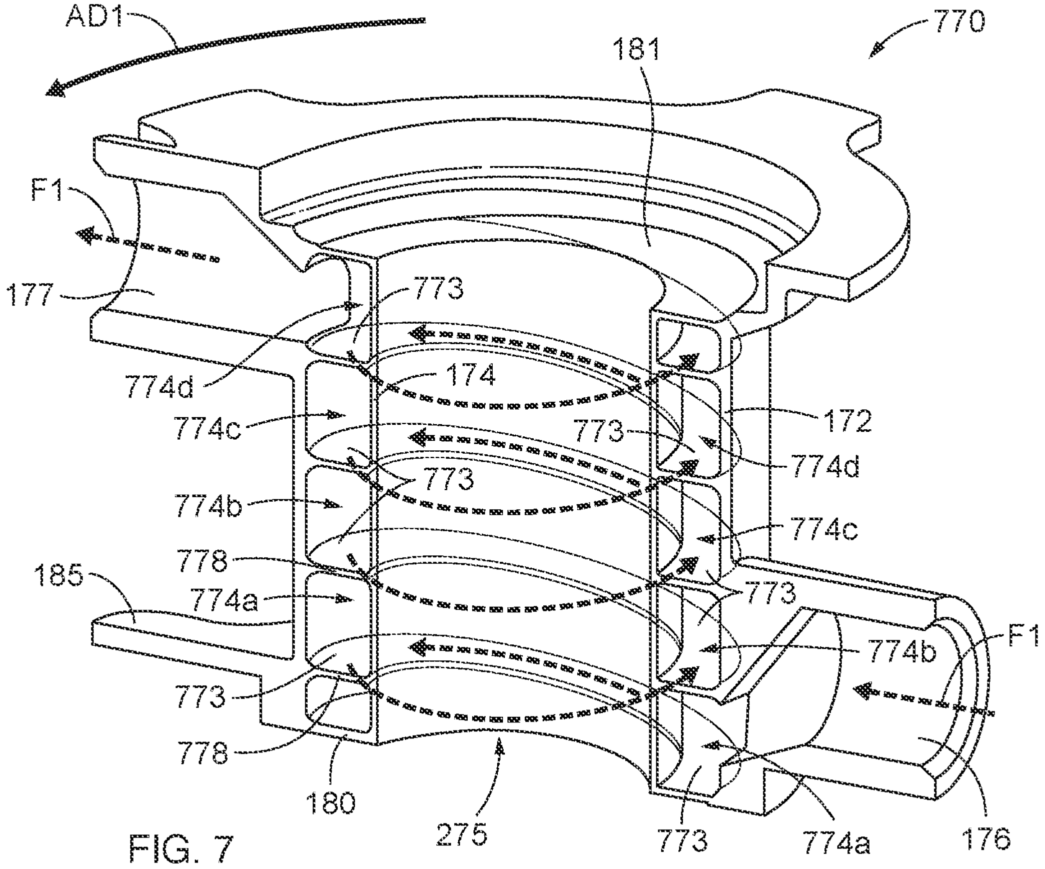
FIG. 7 is a schematic perspective cross-sectional view of a jacket, according to one or more embodiments.

FIG. 7 is a schematic perspective cross-sectional view of a jacket 770, according to one or more embodiments. The jacket 770 can be used in place of the jacket 170 shown in FIG. 1. The jacket 770 includes one or more aspects, features, components, operations, and/or properties of the jacket 170. In the implementation shown in FIG. 7, the fluid outlet 177 is aligned above the fluid inlet 176.

The jacket 170 includes a plurality of partition walls 778 separating a plurality of fluid channels 773. The partition walls 778 extend between the inner wall 174 and at least one of the one or more outer walls 172. The plurality of partition walls 778 extend helically about the inner wall 174. The plurality of fluid channels 773 are arranged in a plurality of channel levels 774*a*-774*d*. The plurality of partition walls 778 intersect the inner wall 174 and at least one of the one or more outer walls 172 to separate the plurality of fluid channels 773 into a plurality of channel levels 774*a*-774*d* extending helically about the inner wall 174. In one or more embodiments, the cooling fluid F1 flows helically through a common volume through the channel levels 774*a*-774*d* between the fluid inlet 176 and the fluid outlet 177. In one or more embodiments, the partition walls 778 are part of a common strip of material wound helically about the inner wall 174.

Figure 8:
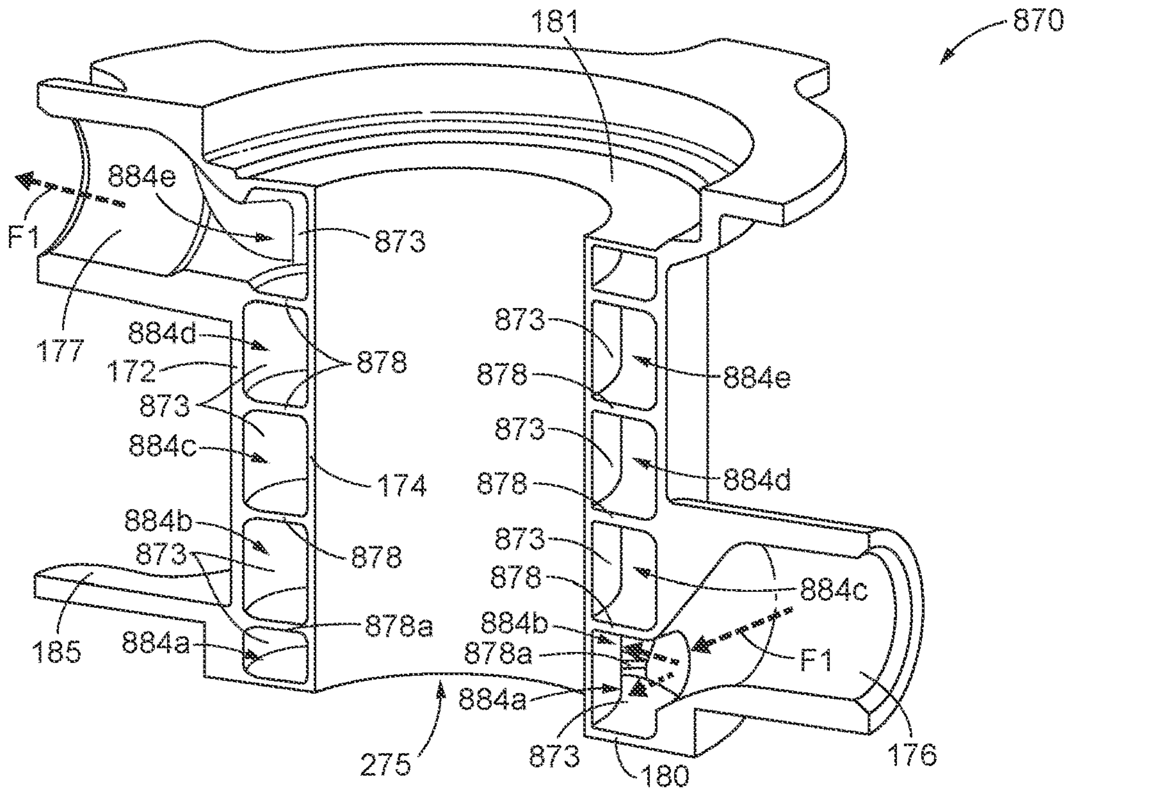
FIG. 8 is a schematic perspective cross-sectional view of a jacket, according to one or more embodiments.

FIG. 8 is a schematic perspective cross-sectional view of a jacket 870, according to one or more embodiments. The jacket 870 can be used in place of the jacket 170 shown in FIG. 1. The jacket 870 includes one or more aspects, features, components, operations, and/or properties of the jacket 770.

The jacket 870 includes a plurality of partition walls 878 separating a plurality of fluid channels 873. An end partition wall 878*a* of the plurality of partition walls 878 is spaced from the first arcuate wall 180 at a terminal end of the end partition wall 878*a* such that the cooling fluid F1 flowing out of the fluid inlet 176 splits between a lowermost channel level 884*a* and a second lowermost channel level 884*b*. In the implementation shown in FIG. 8, the jacket 870 includes five channel levels 884*a*-884*e*. Other numbers of channel levels 884 are contemplated.

Figure 9:
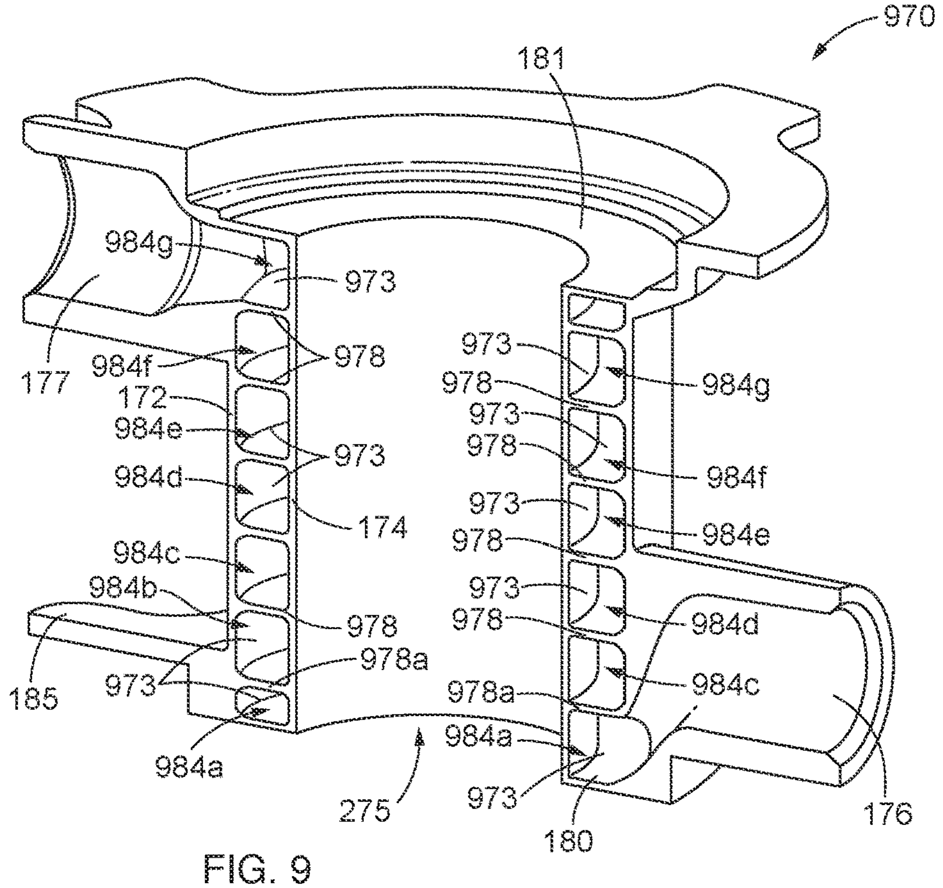
FIG. 9 is a schematic perspective cross-sectional view of a jacket, according to one or more embodiments.

FIG. 9 is a schematic perspective cross-sectional view of a jacket 970, according to one or more embodiments. The jacket 970 can be used in place of the jacket 170 shown in FIG. 1. The jacket 970 includes one or more aspects, features, components, operations, and/or properties of the jacket 870.

The jacket 970 includes a plurality of partition walls 978 separating a plurality of fluid channels 973. In the implementation shown in FIG. 9, the jacket 970 includes seven channel levels 984*a*-984*g*. Other numbers of channel levels 984 are contemplated. Compared to the fluid channels 873 shown in FIG. 8, cross-sectional areas of the fluid channels 973 shown in FIG. 9 can be smaller. For example, the cross-sectional areas of the fluid channels 973 can be about two-thirds the size of the cross-sectional areas of the fluid channels 873. As an example, one or more dimensions (such as a height) of the cross-sectional areas of the fluid channels 973 can be about two-thirds of the height of the cross-sectional areas of the fluid channels 873. The present disclosure contemplates that the cross-sectional areas of fluid channels, the number of fluid channels, and the number of channel levels described herein can vary based on parameters (e.g., target temperatures and/or pumping power for the cooling fluid).

Figure 10:
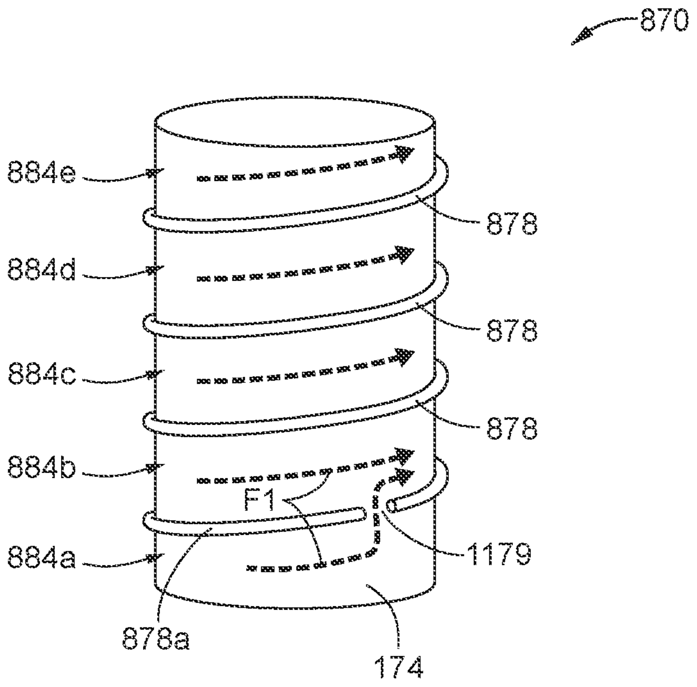
FIG. 10 is a schematic partial perspective view of a helical flow path of the jacket shown in FIG. 8, according to one or more embodiments.

FIG. 10 is a schematic partial perspective view of a helical flow path of the jacket 870 shown in FIG. 8, according to one or more embodiments. The cooling fluid F1 flows between the partition walls 878 as the cooling fluid F1 flows along the helical flow path and about the inner wall 174.

Figure 11:
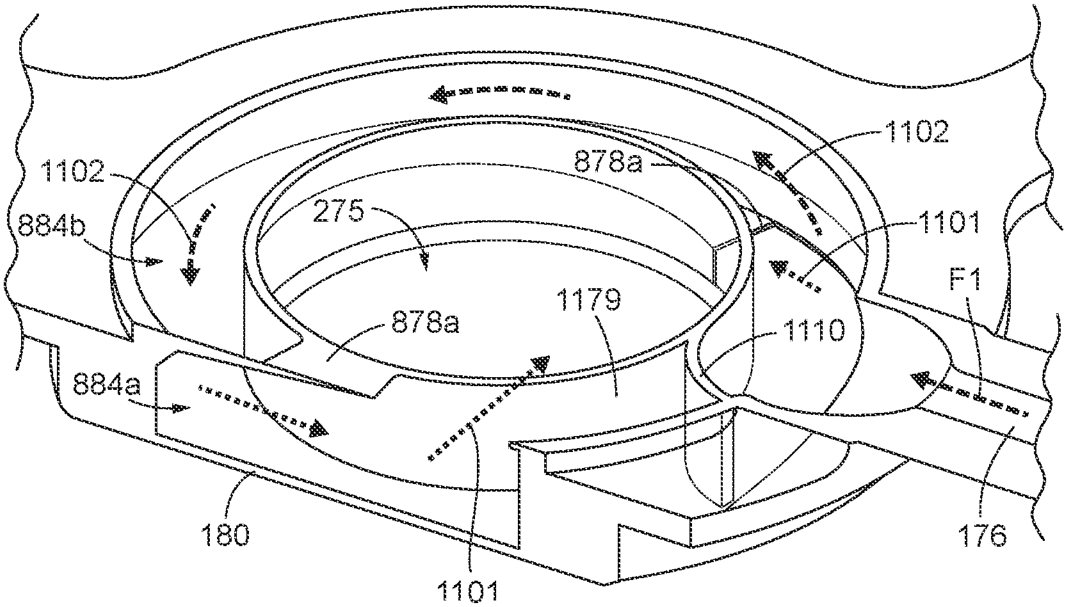
FIG. 11 is a schematic cross-sectional top perspective view of a lower section of the jacket shown in FIG. 8, according to one or more embodiments.

FIG. 11 is a schematic cross-sectional top perspective view of a lower section of the jacket 870 shown in FIG. 8, according to one or more embodiments.

Figure 12:
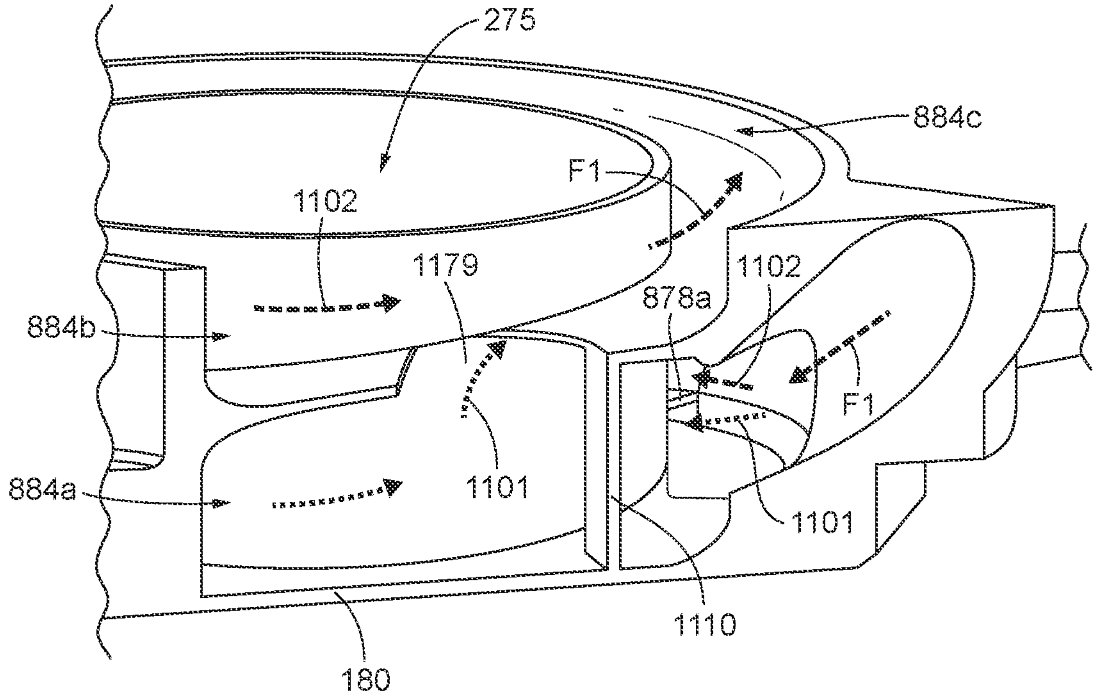
FIG. 12 is a schematic cross-sectional side perspective view of the lower section of the jacket shown in FIG. 11, according to one or more embodiments.

FIG. 12 is a schematic cross-sectional side perspective view of the lower section of the jacket 870 shown in FIG. 11, according to one or more embodiments.

At least one of the plurality of partition walls 878 includes a flow opening 1179 extending therethrough and between two adjacent channel levels of the plurality of channel levels. In one or more embodiments, the end partition wall 878*a* includes the flow opening 1179. As discussed above, the cooling fluid F1 flowing out of the fluid inlet 176 splits as a first flow portion 1101 in the lowermost channel level 884*a* and a second flow portion 1102 in the second lowermost channel level 884*b*. The first flow portion 1101 flows from the lowermost channel level 884*a*, through the flow opening 1179, and into the second lowermost channel level 884*b* such that the first flow portion 1101 and the second flow portion 1102 rejoin with each other prior to flowing to a third lowermost channel level 884c. A vertical partition wall 1110 is disposed in the lowermost channel level 884a and extends between the first arcuate wall 180 and the end partition wall 878a.

The present disclosure contemplates that the flow opening 1179 and/or the 878a can be omitted to achieve a flow path for the cooling fluid F1 that is similar to the flow path shown in FIG. 7.

Figure 13:
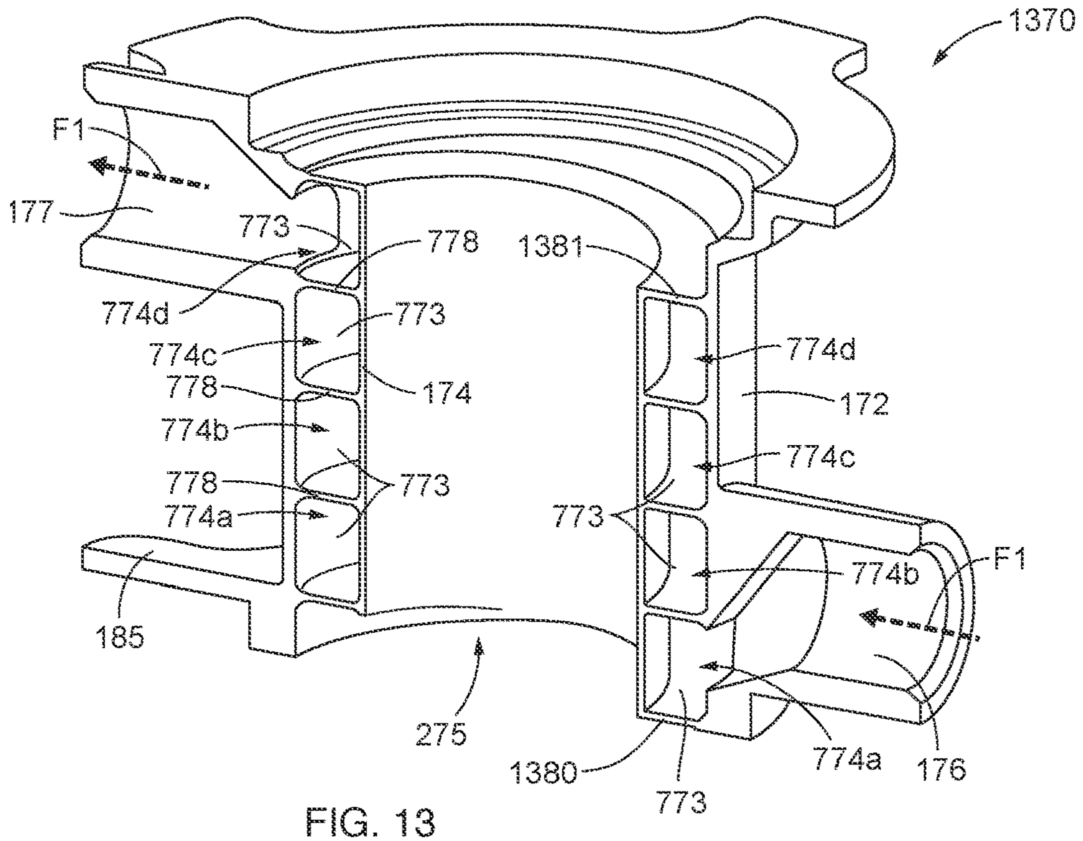
FIG. 13 is a schematic perspective cross-sectional view of a jacket, according to one or more embodiments.

FIG. 13 is a schematic perspective cross-sectional view of a jacket 1370, according to one or more embodiments. The jacket 1370 can be used in place of the jacket 170 shown in FIG. 1. The jacket 1370 includes one or more aspects, features, components, operations, and/or properties of the jacket 770.

The jacket 1370 includes a first arcuate wall 1380 and a second arcuate wall 1381. The first arcuate wall 1380 and the second arcuate wall 1381 are helically swept. In one or more embodiments the first arcuate wall 1380, the second arcuate wall 1381, and the partition walls 778 are part of a common strip of material wound helically about the inner wall 174.

In the implementation shown in FIG. 13, the jacket 1370 includes four channel levels 774a-774d. Other numbers of channel levels 774 are contemplated.

Figure 14:
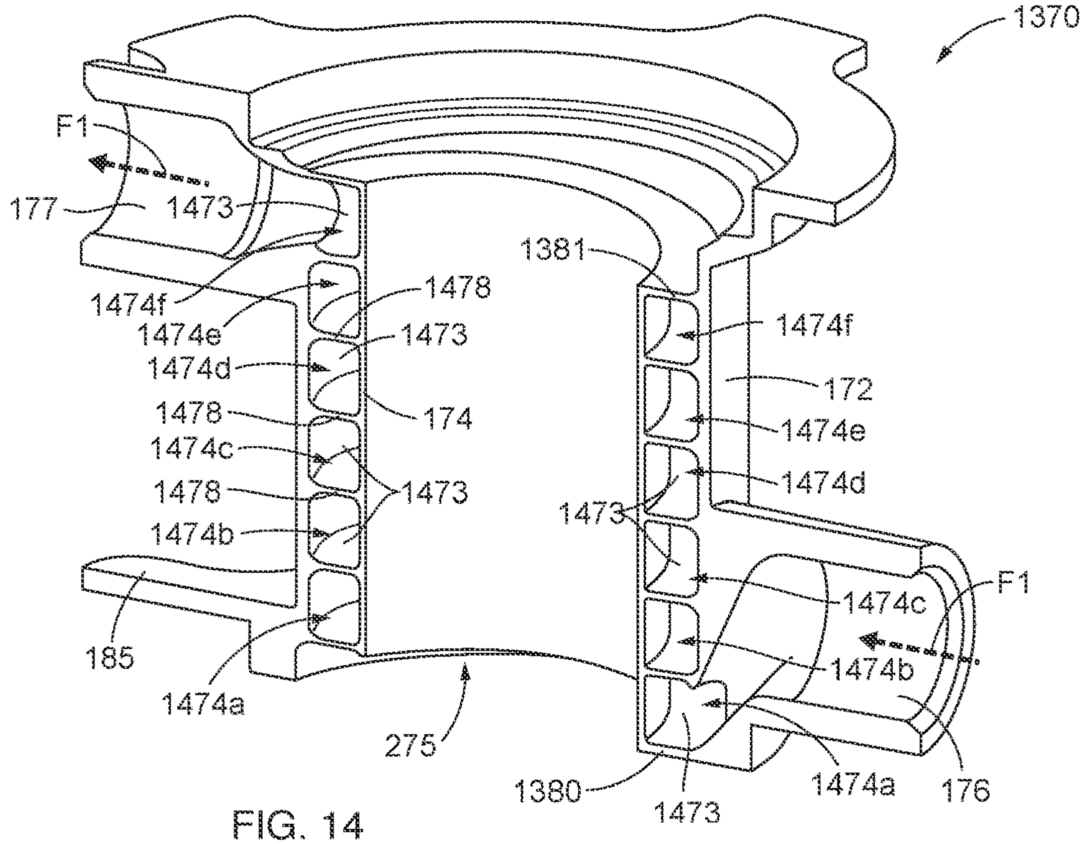
FIG. 14 is a schematic perspective cross-sectional view of a jacket, according to one or more embodiments.

FIG. 14 is a schematic perspective cross-sectional view of a jacket 1470, according to one or more embodiments. The jacket 1470 can be used in place of the jacket 170 shown in FIG. 1. The jacket 1470 includes one or more aspects, features, components, operations, and/or properties of the jacket 1370.

The jacket 1470 includes a plurality of partition walls 1478 separating a plurality of fluid channels 1473. In the implementation shown in FIG. 14, the jacket 1470 includes six channel levels 1474a-1474f. Other numbers of channel levels 1474 are contemplated. Compared to the fluid channels 773 shown in FIG. 13, cross-sectional areas of the fluid channels 1473 shown in FIG. 14 can be smaller. For example, the cross-sectional areas of the fluid channels 1473 can be about two-thirds the size of the cross-sectional areas of the fluid channels 773. As an example, one or more dimensions (such as a height) of the cross-sectional areas of the fluid channels 1473 can be about two-thirds of the height of the cross-sectional areas of the fluid channels 773.

Figure 15:
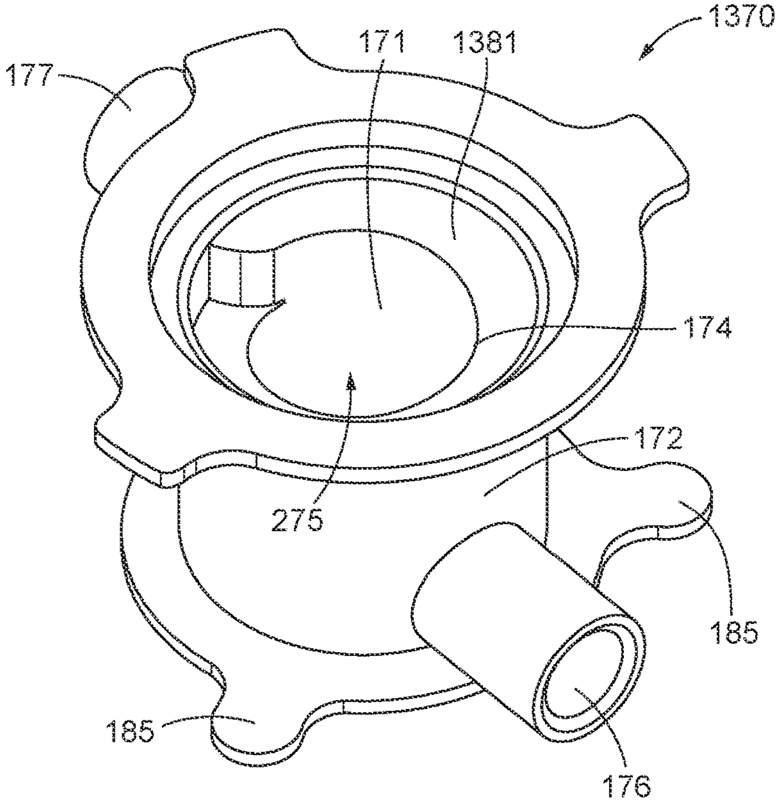
FIG. 15 is a schematic perspective view of a top side of the jacket shown in FIG. 13, according to one or more embodiments.

FIG. 15 is a schematic perspective view of a top side of the jacket 1370 shown in FIG. 13, according to one or more embodiments.

Figure 16:
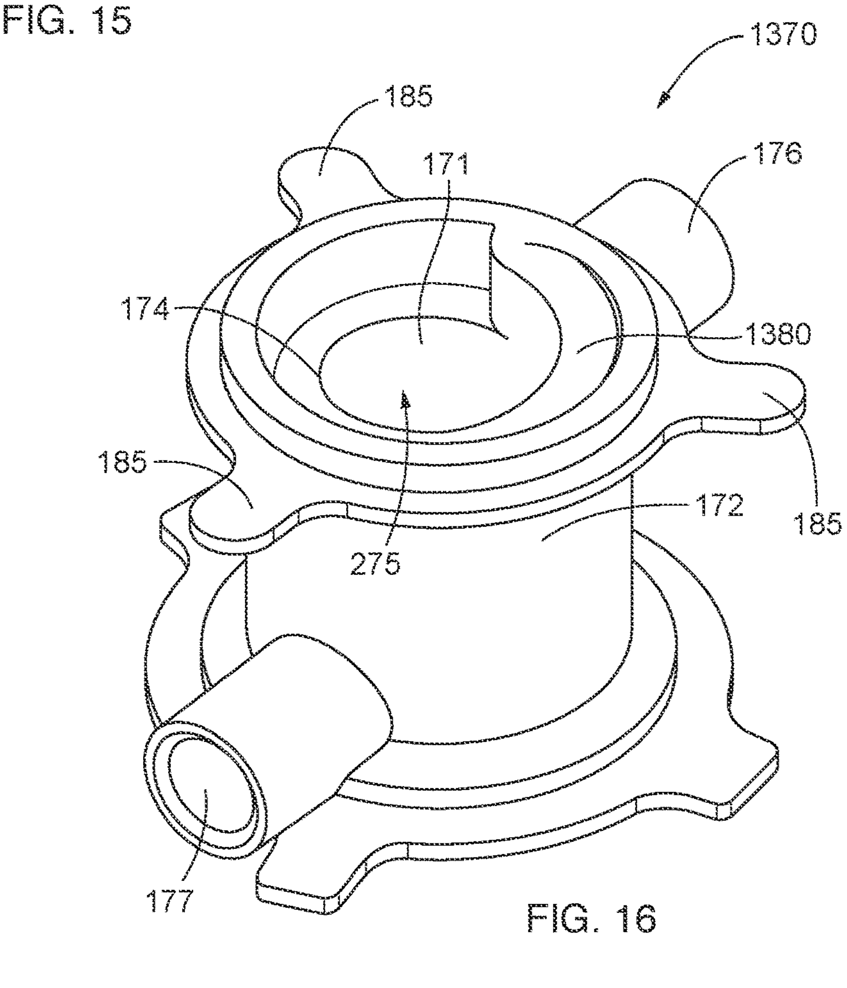
FIG. 16 is a schematic perspective view of a bottom side of the jacket shown in FIG. 15, according to one or more embodiments.

FIG. 16 is a schematic perspective view of a bottom side of the jacket 1370 shown in FIG. 15, according to one or more embodiments.

Figure 17:
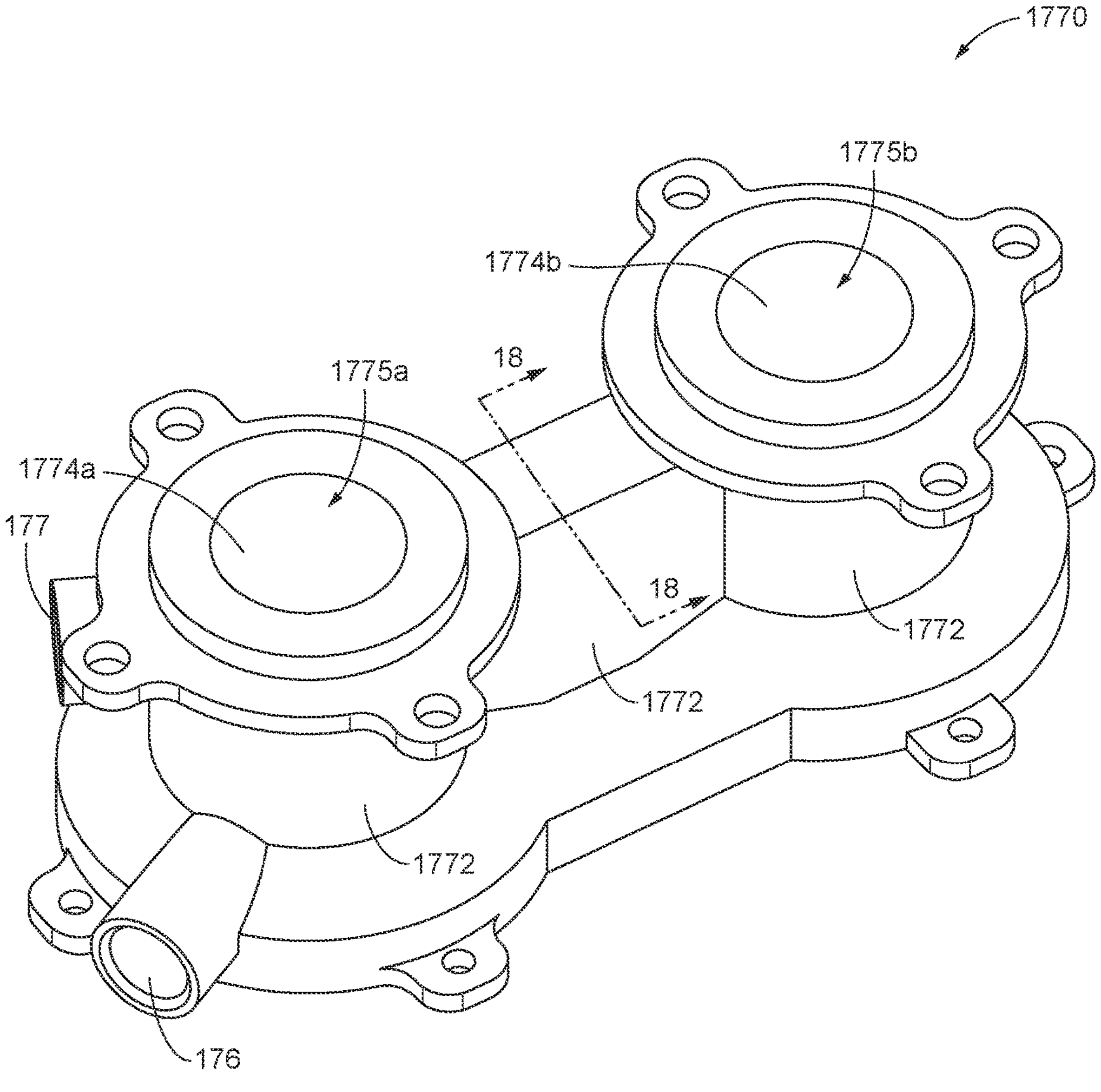
FIG. 17 is a schematic perspective view of a jacket, according to one or more embodiments.

FIG. 17 is a schematic perspective view of a jacket 1770, according to one or more embodiments.

The jacket 1770 is similar to the jacket 170 and includes one or more aspects, features components, operations, and/or properties thereof. The jacket 1770 includes one or more outer walls 1772 bounding a plurality of fluid channels, a first inner wall 1774a at least partially surrounded by at least one of the plurality of fluid channels, and a second inner wall 1774b at least partially surrounded by at least one of the plurality of fluid channels. The first inner wall 1774a at least partially defines a first receptacle opening 1775a, and the second inner wall 1774b at least partially defines a second receptacle opening 1775b. The jacket 1770 includes the fluid inlet 176 formed in at least one of the one or more outer walls 1772, and the fluid outlet 177 formed in at least one of the one or more outer walls 1772. In one or more embodiments, the first inner wall 1774a is a sleeve and/or the second inner wall 1774b is a sleeve.

Figure 18:
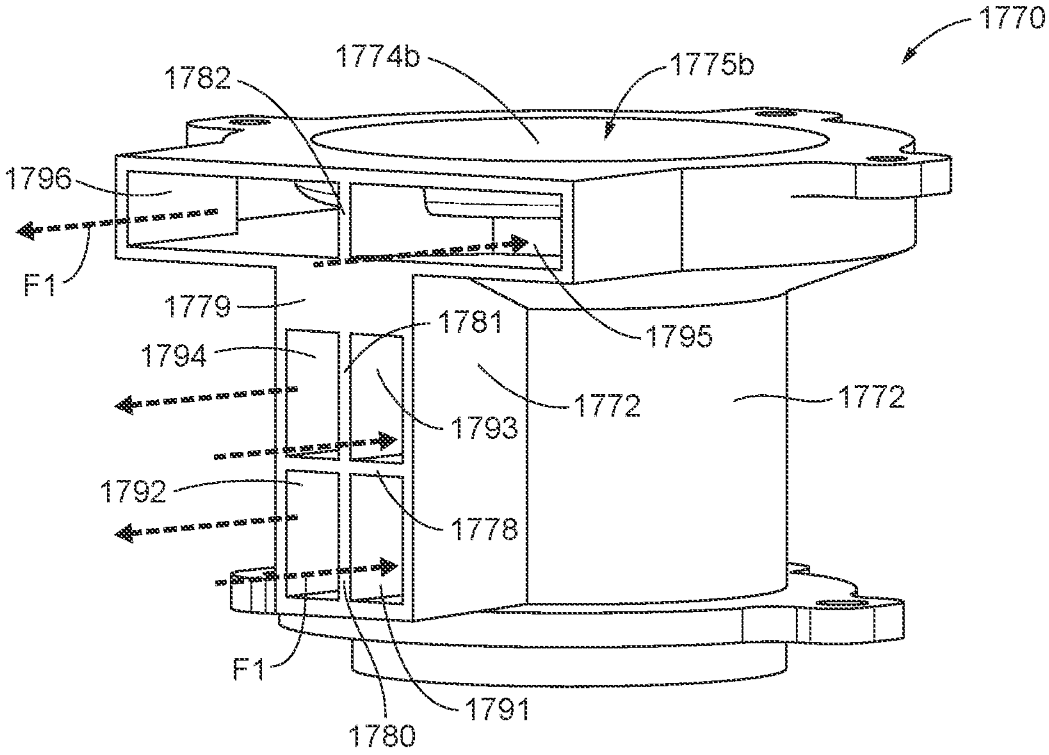
FIG. 18 is a schematic cross-sectional view, along Section 18-18 shown in FIG. 17, of the jacket, according to one or more embodiments.

FIG. 18 is a schematic cross-sectional view, along Section 18-18 shown in FIG. 17, of the jacket 1770, according to one or more embodiments.

The jacket 1770 includes a plurality of partition walls 1778-1782 separating the plurality of fluid channels. The plurality of partition walls 1778-1782 includes one or more first partition walls 1778, 1779 (a plurality is shown) separating the plurality of fluid channels into a plurality of channel levels (three are shown in FIG. 18), and one or more second partition walls 1780-1782 (a plurality is shown) oriented at an oblique angle relative to at least one of the one or more first partition walls 1778, 1779. The one or more second partition walls 1780-1782 separate each of the plurality of channel levels into a plurality of channel sections 1791-1796. The receptacle openings 1775a-1775b can each receive a sensor device such that the jacket 1770 is a multi-sensor (e.g., dual-sensor) jacket. The present disclosure contemplates that the jacket 1770 can include additional receptacle openings to receive additional sensor devices therein.

The cooling fluid F1 flows through the fluid inlet 176 and into a first channel section 1791, through a first arcuate channel section 1901 (shown in FIG. 19) extending at least partially about the second inner wall 1774b, and into a second channel section 1792. The cooling fluid F1 flows through the second channel section 1792, through a second arcuate channel section 1902 (shown in FIG. 19) extending at least partially about the first inner wall 1774a, and into a third channel section 1793. The cooling fluid F1 flows through the third channel section 1793, through a third arcuate channel section 1903 (shown in FIG. 19) extending at least partially about the second inner wall 1774b, and into a fourth channel section 1794. The cooling fluid F1 flows through the fourth channel section 1794, through a fourth arcuate channel section 1904 (shown in FIG. 19) extending at least partially about the first inner wall 1774a, and into a fifth channel section 1795. The cooling fluid F1 flows through the fifth channel section 1795, through a fifth arcuate channel 1905 (shown in FIG. 19) section extending at least partially about the second inner wall 1774b, and into a fifth channel section 1795. The cooling fluid F1 flows through the fifth channel section 1795 and out through the fluid outlet 177. The second arcuate channel section 1902 can extend arcuately and upwardly (e.g., along a helical pattern) between the second channel section 1792 and the third channel section 1793. The fourth arcuate channel section 1904 can extend arcuately and upwardly (e.g., along a helical pattern) between the fourth channel section 1794 and the fifth channel section 1795.

The channel sections 1791-1796 extend between the first inner wall 1774a and the second inner wall 1774b, and the arcuate channel sections 1901-1905 extend—respectively—at least partially about the first inner wall 1774a or the second inner wall 1774b. The present disclosure contemplates that partition walls 1911-1913 can separate the arcuate channel sections 1901-1905 from each other.

Figure 19:
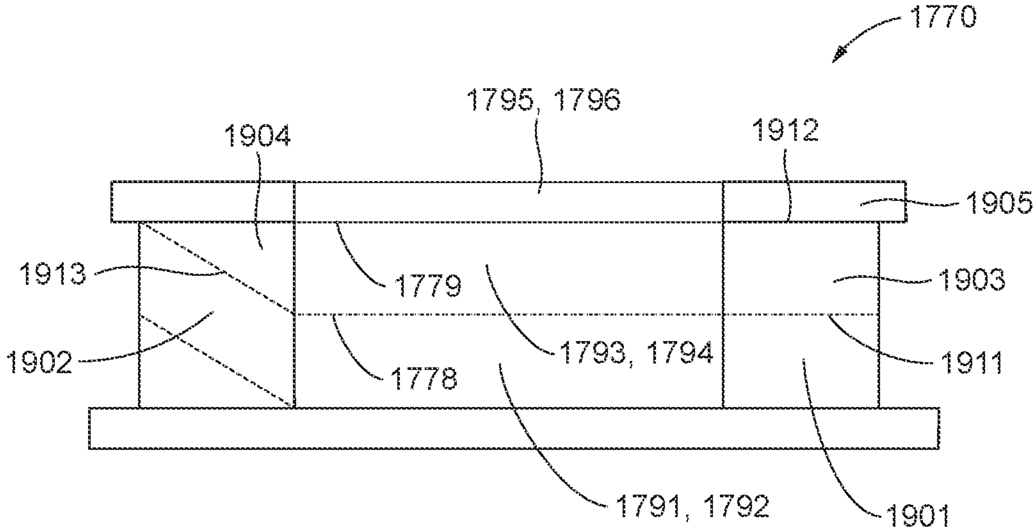
FIG. 19 is a schematic partial side view of the jacket shown in FIGS. 17 and 18, according to one or more embodiments.

FIG. 19 is a schematic partial side view of the jacket 1770 shown in FIGS. 17 and 18, according to one or more embodiments.

In one or more embodiments, any jacket described herein (such as the jacket 170, the jacket 370, the jacket 770, the jacket 870, the jacket 970, the jacket 1370, the jacket 1470, and/or the jacket 1770) is at least partially formed of 316L stainless steel. As an example, at least the respective one or more outer walls, the respective inner wall, and/or the respective plurality of partition walls are formed of 316L stainless steel. In one or more embodiments, any jacket described herein (such as the jacket 170, the jacket 370, the jacket 770, the jacket 870, the jacket 970, the jacket 1370, the jacket 1470, and/or the jacket 1770) is at least partially formed using one or more of casting, additive manufacturing (such as three-dimensional printing), compression molding (such as pressed powder molding), and/or injection molding.

Figure 20:
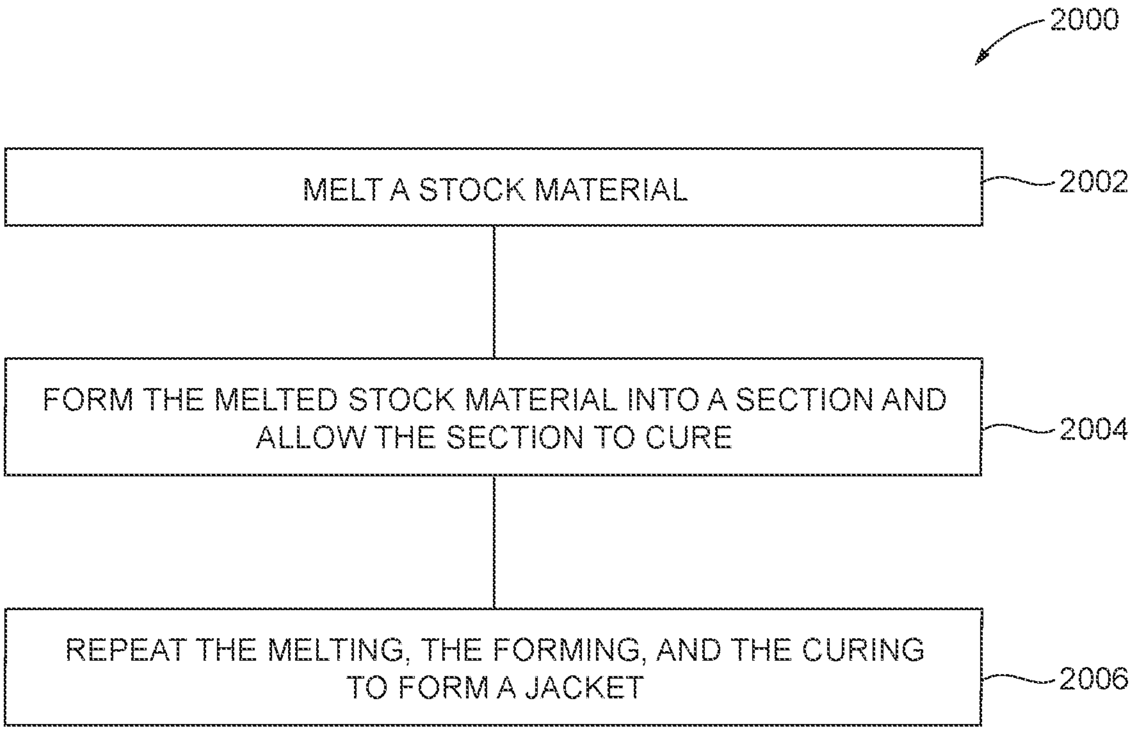
FIG. 20 is a schematic block diagram view of a method of making jackets applicable for semiconductor manufacturing, according to one or more embodiments.

FIG. 20 is a schematic block diagram view of a method 2000 of making jackets applicable for semiconductor manufacturing, according to one or more embodiments.

Operation 2002 includes melting a stock material. The stock material can include a metallic material and/or a non-metallic material. The metallic material can include aluminum and/or steel. In one or more embodiments, stock material includes 316L stainless steel. The non-metallic material can be polymeric, such as polyether ether ketone (PEEK), polyimide, polyamide, and/or other polymer(s) such as high temperature polymers. In one or more embodiments, the stock material can be re-formed using casting, additive manufacturing (such as three-dimensional printing), compression molding (such as pressed powder molding), and/or injection molding. The stock material can include one or more fillers such as boron nitride, aluminum nitride, silicon carbide, carbon, diamond, metal powder(s) such as aluminum and/or iron, and/or carbon nanotubes or similar carbon-based structures such as carbon fiber and/or graphene.

Operation 2004 includes forming the melted stock material into a section and allowing the section to cure.

Operation 2006 includes repeating the melting (of operation 2002), the forming (of operation 2004), and the curing (of operation 2004) for one or more additional sections to form a jacket. The jacket can be any of the jacket 170, the jacket 370, the jacket 770, the jacket 870, the jacket 970, the jacket 1370, the jacket 1470, and/or the jacket 1770.

Using the subject matter described herein, it is believed that a maximum temperature of the jackets can be less than 50 degrees Celsius (such as within a range of 30 degrees Celsius to 45 degrees Celsius, for example about 33 degrees Celsius) with a pressure drop (of the cooling fluid F1) that is less than 30 psi, such as within a range of 14 psi to 16 psi. By using such maximum temperatures, the one or more brackets 1003 are maintained at temperatures below a target temperature that is within a range of 30 degrees Celsius to 40 degrees Celsius, thereby reducing or eliminating bracket failures and increasing maintenance intervals. By using such maximum temperatures, the sensor 1002 is maintained at a temperature below a target temperature that is within a range of 80 degrees Celsius to 90 degrees Celsius (such as about 85 degrees Celsius), thereby reducing or eliminating sensor failures, increasing measurement accuracy, and increasing maintenance intervals.

FIG. 21 is a schematic table view of pressure drop values and maximum temperature values for a variety of jacket cases, according to one or more embodiments. Cases 2-4 use subject matter described herein and are believed to exhibit lower maximum temperatures than Case 1.

FIG. 22 is a schematic table view of power values and maximum temperature values for a variety of jacket cases, according to one or more embodiments. The power values refer to the power applied to the sensor device(s) received in the jacket.

Cases 3 and 4 use subject matter described herein and are believed to exhibit lower maximum temperatures than Cases 1 and 2.

Figure 23:
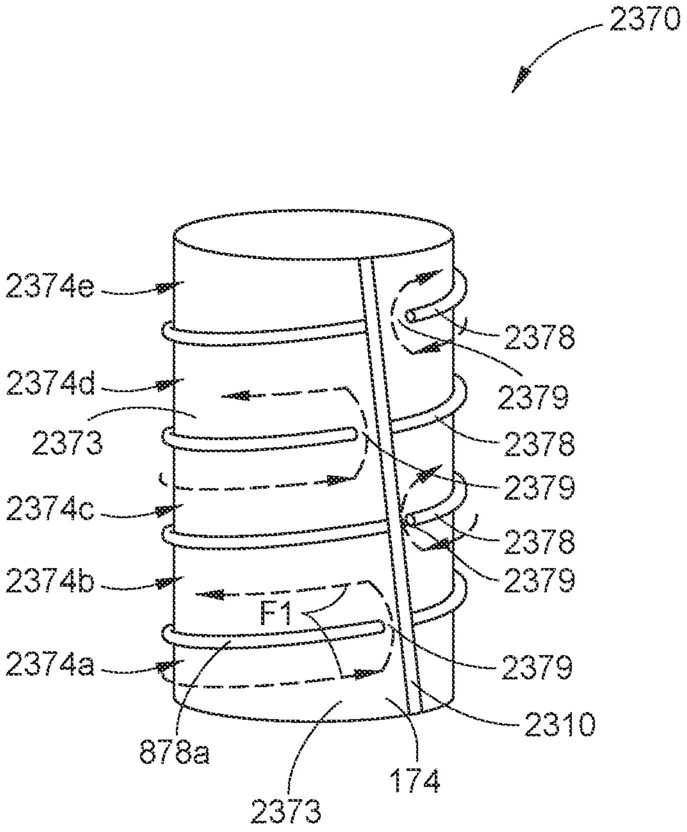
FIG. 23 is a schematic partial perspective view of a semi-helical flow path of a jacket, according to one or more embodiments.

FIG. 23 is a schematic partial perspective view of a semi-helical flow path of a jacket 2370, according to one or more embodiments.

The jacket 2370 can be used in place of the jacket 170 shown in FIG. 1. The jacket 2370 includes one or more aspects, features, components, operations, and/or properties of the jacket 770 and/or jacket 870.

The jacket 2370 includes a plurality of partition walls 2378 separating a plurality of fluid channels 2373. The plurality of partition walls 2378 extend helically about the inner wall 174. The present disclosure contemplates that the partition walls 2378 can extend semi-helically about the inner wall 174. The plurality of fluid channels 2373 are arranged in a plurality of channel levels 2374*a*-2374*e*. The plurality of partition walls 2378 intersect the inner wall 174 and at least one of the one or more outer walls 172 to separate the plurality of fluid channels 2373 into the plurality of channel levels 2374*a*-2374*e* extending semi-helically about the inner wall 174.

One or more vertical partition walls 2310 are disposed in the channel levels 2374*a*-2374*e* to direct the flow of cooling fluid F1 vertically (e.g., upwardly) between channel levels 2374*a*-2374*e*. The plurality of partition walls 2378 respectively include a flow opening 2379 extending therethrough and between two adjacent channel levels of the plurality of channel levels 2374*a*-2374*e*. In one or more embodiments, the one or more vertical partition walls 2310 include a vertical partition wall spanning the channel levels 2374*a*-2374*e*. In one or more embodiments, the one or more vertical partition walls 2310 include a plurality of vertical partition walls corresponding respectively to the channel levels 2374*a*. The present disclosure contemplates that the number of vertical partition walls 2310 can be equal to the number of fluid inlet(s) 176. The implementation shown in FIG. 23 illustrates one fluid inlet 176 and one vertical partition wall 2310. Other numbers are contemplated for the fluid inlet(s) 176 and the vertical partition wall(s) 2310.

The cooling fluid F1 flows between the partition walls 2378 and through the flow openings 2379 as the cooling fluid F1 flows along the semi-helical flow path and about the inner wall 174. The vertical partition wall(s) 2310 and the helical partition walls 2378 facilitate a semi-helical flow path for the cooling fluid F1. The semi-helical flow path includes helical sections and vertical sections where the cooling fluid F1 flows between channel levels. The one or more vertical partition walls 2310 facilitate reversing flow of the cooling fluid F1 between channel levels. Sections of the vertical partition wall 2310—or a plurality of vertical partition walls 2310, is used—respectively fluidly divide each channel level 2374*a*-2374*e* into at least two sections. In one or more embodiments, the cooling fluid F1 flows semi-helically through a common volume through the channel levels 2374*a*-2374*e* between the fluid inlet 176 and the fluid outlet 177.

Figure 24:
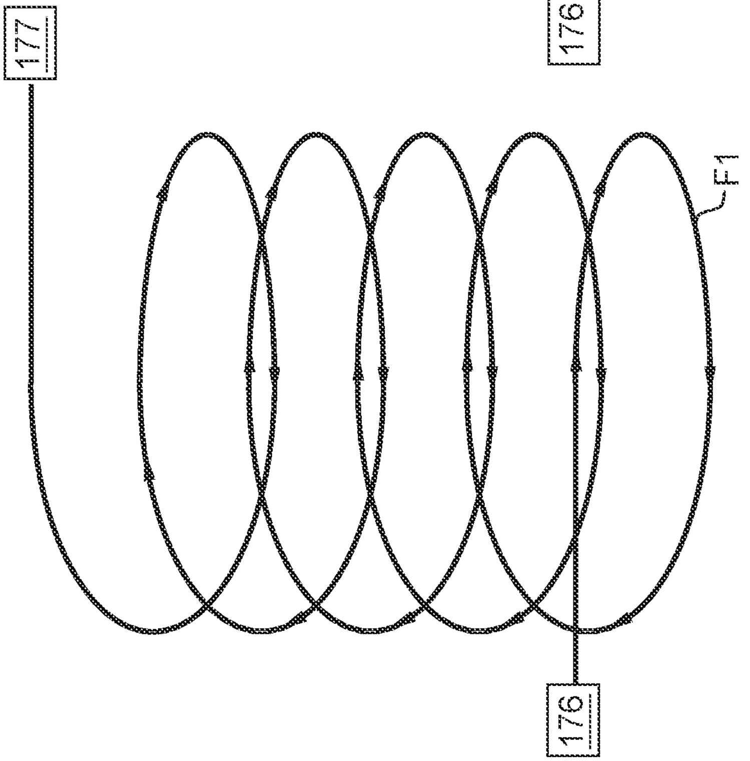
FIG. 24 is a schematic view of a helical flow path that can be facilitated, for example, using a configuration such as that shown in FIG. 7, according to one or more embodiments.

FIG. 24 is a schematic view of a helical flow path that can be facilitated, for example, using a configuration such as that shown in FIG. 7, according to one or more embodiments.

Figure 25:
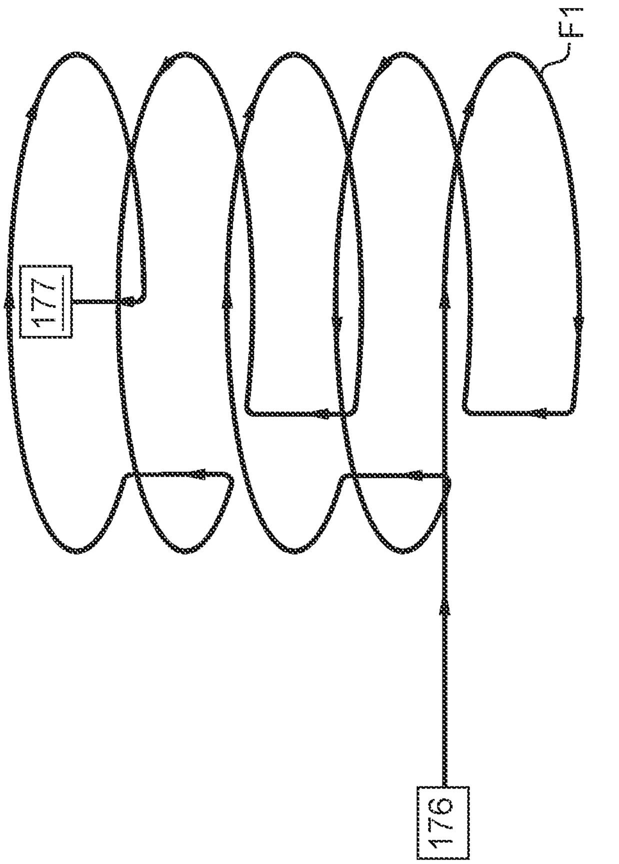
FIG. 25 is a schematic view of a semi-helical flow path that can be facilitated, for example, using a configuration such as that shown in FIG. 23, according to one or more embodiments.

FIG. 25 is a schematic view of a semi-helical flow path that can be facilitated, for example, using a configuration such as that shown in FIG. 23, according to one or more embodiments.

Benefits of the present disclosure include reduced maximum temperatures for jackets with reduced pressure drops; reduced temperature gradients; reduced operating temperatures for sensor mounting brackets and sensors; increased measurement accuracy; increased maintenance intervals; reduced chamber downtime; reduced processing delays; and increased throughput. Benefits also include reduced component degradation; increased component lifespans; simplicity in jacket design; and modularity in jacket application (e.g., by retrofitting a variety of chambers with the jackets).

It is contemplated that one or more aspects disclosed herein may be combined. As an example, one or more aspects, features, components, operations and/or properties of the processing chamber 100, the controller 190, the one or more sensor devices 195, 196, 197, 198, the jacket 170, the jacket 370, the jacket 770, the jacket 870, the jacket 970, the jacket 1370, the jacket 1470, the jacket 1770, the method 2000, the values shown in FIG. 21, the values shown in FIG. 22, the jacket 2370, the helical flow path shown in FIG. 24, and/or the semi-helical flow path shown in FIG. 25 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A jacket applicable for semiconductor manufacturing, the jacket comprising:
- one or more outer walls bounding a plurality of fluid channels;
- an inner wall at least partially surrounded by at least one of the plurality of fluid channels, the inner wall at least partially defining a receptacle opening;
- a fluid inlet formed in at least one of the one or more outer walls;
- a fluid outlet formed in at least one of the one or more outer walls;
- a plurality of partition walls separating the plurality of fluid channels, at least one of the plurality of partition walls intersecting at least one of the one or more outer walls;
- a first arcuate wall; and
- a second arcuate wall, the first and second arcuate walls extending between the inner wall and at least one of the one or more outer walls.

2. The jacket of claim 1, wherein the plurality of partition walls comprise:
- a set of first partition walls extending between the inner wall and at least one of the one or more outer walls, the first partition walls intersecting the first arcuate wall and spaced from the second arcuate wall; and
- a set of second partition walls extending between the inner wall and at least one of the one or more outer walls, the second partition walls intersecting the second arcuate wall and spaced from the first arcuate wall.

3. The jacket of claim 2, wherein the first partition walls and the second partition walls are disposed in an alternating arrangement along an arcuate direction to define a serpentine flow path along the arcuate direction.

4. The jacket of claim 3, wherein the first partition walls and the second partition walls are spaced from each other by an azimuthal angle within a range of 35 degrees to 55 degrees.

5. The jacket of claim 3, wherein the first partition walls and the second partition walls are spaced from each other by an azimuthal angle within a range of 20 degrees to 40 degrees.

6. The jacket of claim 1, wherein the plurality of partition walls extend helically about the inner wall, and the plurality of partition walls intersect the inner wall and at least one of the one or more outer walls to separate the plurality of fluid channels into a plurality of channel levels extending helically or semi-helically about the inner wall.

7. The jacket of claim 6, wherein at least one partition wall of the plurality of partition walls comprises a flow opening extending therethrough and between two adjacent channel levels of the plurality of channel levels.

8. The jacket of claim 6, wherein the first arcuate wall and the second arcuate wall are helically swept.

9. The jacket of claim 1, wherein the plurality of partition walls comprise:
- one or more first partition walls separating the plurality of fluid channels into a plurality of channel levels; and
- one or more second partition walls oriented at an oblique angle relative to at least one of the one or more first partition walls, the one or more second partition walls separating each of the plurality of channel levels into a plurality of channel sections.

10. The jacket of claim 9, wherein the inner wall is a sleeve and the jacket further comprises a second inner wall at least partially defining a second receptacle opening, the plurality of channel sections extending between the inner wall and the second inner wall.

11. The jacket of claim 1, wherein the one or more outer walls, the inner wall, and the plurality of partition walls are formed of 316L stainless steel.

12. A sensor assembly applicable for semiconductor manufacturing, the sensor assembly comprising:
- a jacket comprising:
  - one or more outer walls bounding a plurality of fluid channels,
  - an inner wall at least partially defining a receptacle opening,
  - a fluid inlet,
  - a fluid outlet,
  - a plurality of partition walls separating the plurality of fluid channels, at least one of the plurality of partition walls intersecting at least one of the one or more outer walls, and
  - one or more mounting flanges extending outwardly relative to the inner wall; and
- a sensor device disposed at least partially in the receptacle opening of the jacket, the sensor device comprising:
  - a housing mounted to the jacket, and
  - a sensor configured to detect one or more properties.

13. The sensor assembly of claim 12, wherein the sensor comprises one or more silicon (Si), carbon (C), gallium (Ga), or nitrogen (N).

14. The sensor assembly of claim 12, wherein the plurality of partition walls comprise:
- a set of first partition walls extending between the inner wall and at least one of the one or more outer walls; and
- a set of second partition walls extending between the inner wall and at least one of the one or more outer walls, wherein the first partition walls and the second partition walls are disposed in an alternating arrangement along an arcuate direction to define a serpentine flow path along the arcuate direction.

15. The sensor assembly of claim 12, wherein the plurality of partition walls extend helically about the inner wall, and the plurality of partition walls intersect the inner wall and at least one of the one or more outer walls to separate the plurality of fluid channels into a plurality of channel levels extending helically or semi-helically about the inner wall.

16. The sensor assembly of claim 12, wherein the plurality of partition walls comprise:
- one or more first partition walls separating the plurality of fluid channels into a plurality of channel levels; and one or more second partition walls oriented at an oblique angle relative to at least one of the one or more first partition walls, the one or more second partition walls separating each of the plurality of channel levels into a plurality of channel sections.

17. A jacket applicable for semiconductor manufacturing, the jacket comprising:

one or more outer walls bounding a plurality of fluid channels;

an inner wall at least partially surrounded by at least one of the plurality of fluid channels, the inner wall at least partially defining a receptacle opening, and the inner wall is a sleeve;

a second inner wall at least partially defining a second receptacle opening, the plurality of channel sections extending between the inner wall and the second inner wall;

a fluid inlet formed in at least one of the one or more outer walls;

a fluid outlet formed in at least one of the one or more outer walls;

a plurality of partition walls separating the plurality of fluid channels, at least one of the plurality of partition walls intersecting at least one of the one or more outer walls, the plurality of partition walls comprising:

one or more first partition walls separating the plurality of fluid channels into a plurality of channel levels, and one or more second partition walls oriented at an oblique angle relative to at least one of the one or more first partition walls, the one or more second partition walls separating each of the plurality of channel levels into a plurality of channel sections.

18. The jacket of claim 17, wherein the plurality of partition walls comprise:

a set of first partition walls extending between the inner wall and at least one of the one or more outer walls, the first partition walls intersecting the first arcuate wall and spaced from the second arcuate wall; and a set of second partition walls extending between the inner wall and at least one of the one or more outer walls, the second partition walls intersecting the second arcuate wall and spaced from the first arcuate wall.

19. The jacket of claim 18, wherein the first partition walls and the second partition walls are disposed in an alternating arrangement along an arcuate direction to define a serpentine flow path along the arcuate direction.

20. The jacket of claim 17, wherein the plurality of partition walls extend helically about the inner wall, and the plurality of partition walls intersect the inner wall and at least one of the one or more outer walls to separate the plurality of fluid channels into a plurality of channel levels extending helically or semi-helically about the inner wall.

* * * * *